(12) United States Patent
Ito et al.

(10) Patent No.: US 7,727,809 B2
(45) Date of Patent: Jun. 1, 2010

(54) ATTACHMENT METHOD, ATTACHMENT APPARATUS, MANUFACTURING METHOD OF SEMICONDUCTOR DEVICE, AND MANUFACTURING APPARATUS OF SEMICONDUCTOR DEVICE

(75) Inventors: Kyosuke Ito, Kanagawa (JP); Osamu Nakamura, Kanagawa (JP); Yukie Suzuki, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 188 days.

(21) Appl. No.: 11/798,979

(22) Filed: May 18, 2007

(65) Prior Publication Data
US 2007/0281391 A1    Dec. 6, 2007

(30) Foreign Application Priority Data
May 31, 2006    (JP)    ............................. 2006-151506

(51) Int. Cl.
*H01L 21/00*    (2006.01)
(52) U.S. Cl. ............................... 438/110; 257/E23.065
(58) Field of Classification Search ................. 257/728, 257/E23.065; 438/107, 109, 110, 125
See application file for complete search history.

(56) References Cited
U.S. PATENT DOCUMENTS
7,141,451 B2    11/2006    Tsunoda et al.
2005/0085010 A1    4/2005    Tsunoda et al.
2006/0252182 A1*    11/2006    Wang et al. .................. 438/110
2008/0042168 A1*    2/2008    Watanabe et al. ........... 257/204

FOREIGN PATENT DOCUMENTS
| EP | 1 522 956 A1 | 4/2005 |
| JP | 2000-299598 | 10/2000 |
| JP | 2005-115646 | 4/2005 |

* cited by examiner

*Primary Examiner*—David A. Zarneke
*Assistant Examiner*—Jenny L Wagner
(74) *Attorney, Agent, or Firm*—Nixon Peabody LLP; Jeffrey L. Costellia

(57) ABSTRACT

The invention proposes a method and an apparatus for attaching a plurality of components having different arrangement densities or arrangement intervals, which can achieve shorter takt time. An object is to provide a low-cost manufacturing method of a semiconductor device and a manufacturing apparatus capable of manufacturing a semiconductor device at low cost. Plural pairs of components having different arrangement densities are simultaneously attached to each other by temporarily attaching first components to a first flexible substrate while changing an arrangement interval in an X direction, and then connecting the first components to second components over a second flexible substrate while changing an arrangement interval of the first components in a Y direction.

12 Claims, 22 Drawing Sheets

ROW DIRECTION OF SEMICONDUCTOR INTEGRATED CIRCUIT ↑

ROW DIRECTION OF ANTENNA ←

ROW DIRECTION OF SEMICONDUCTOR INTEGRATED CIRCUIT

ROW DIRECTION OF ANTENNA

ROW DIRECTION OF SEMICONDUCTOR INTEGRATED CIRCUIT

ROW DIRECTION OF ANTENNA

ROW DIRECTION OF SEMICONDUCTOR INTEGRATED CIRCUIT

ROW DIRECTION OF ANTENNA

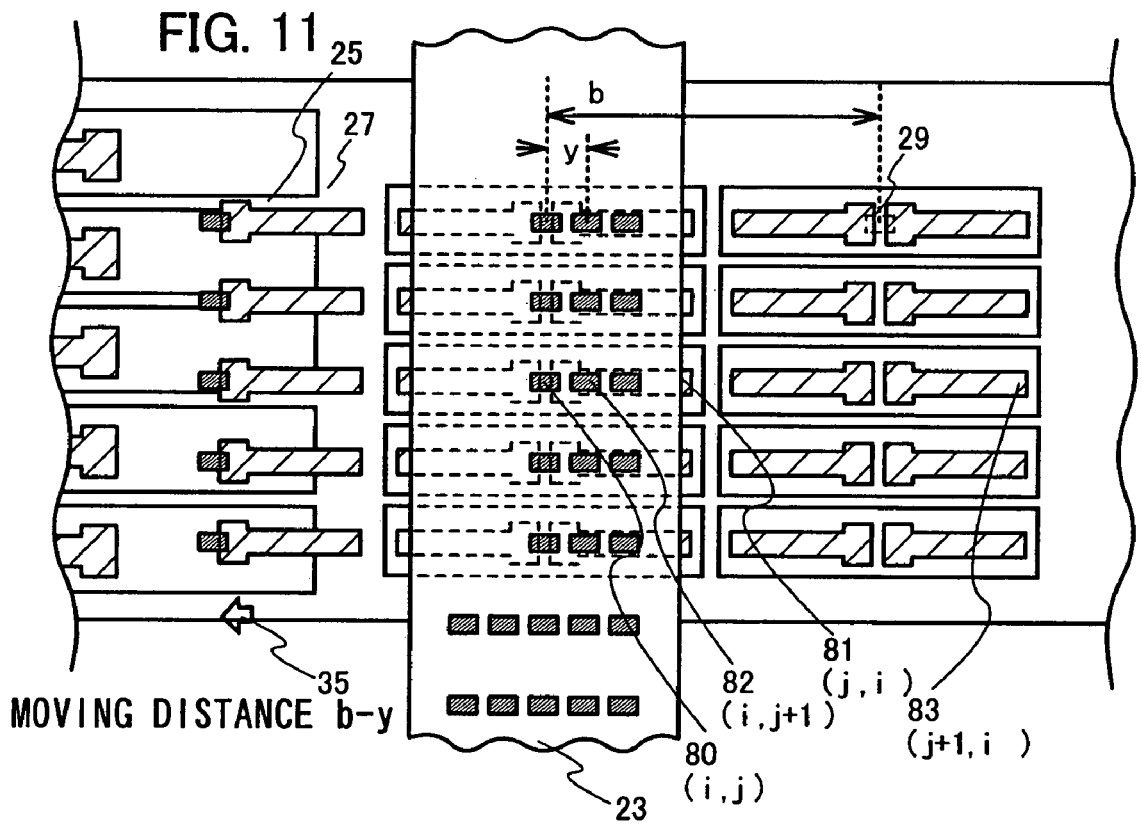

ROW DIRECTION OF SEMICONDUCTOR INTEGRATED CIRCUIT

ROW DIRECTION OF ANTENNA $\theta = \arctan(y/a)$

ROW DIRECTION OF SEMICONDUCTOR INTEGRATED CIRCUIT

ROW DIRECTION OF ANTENNA

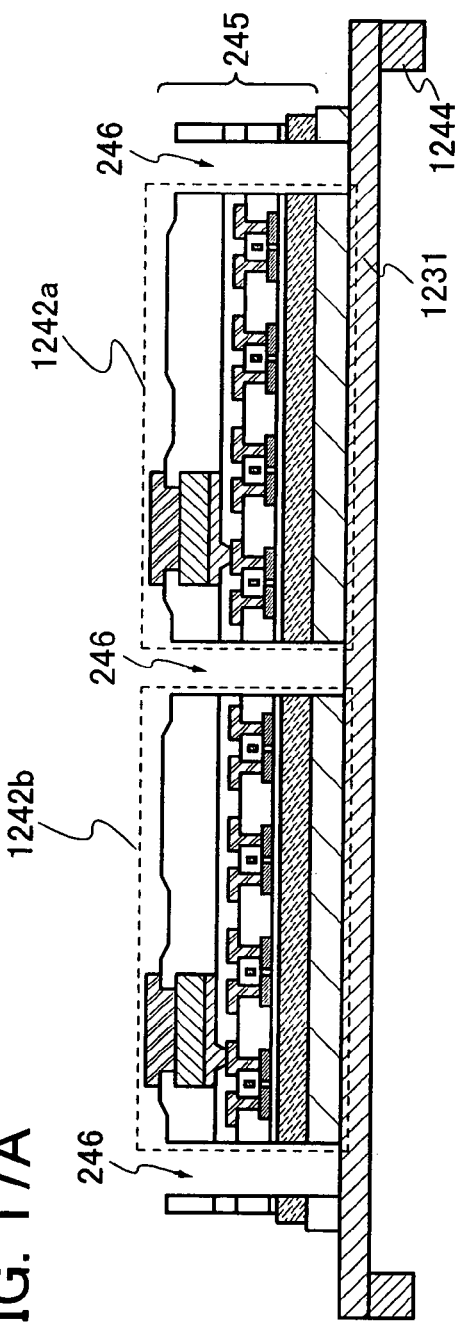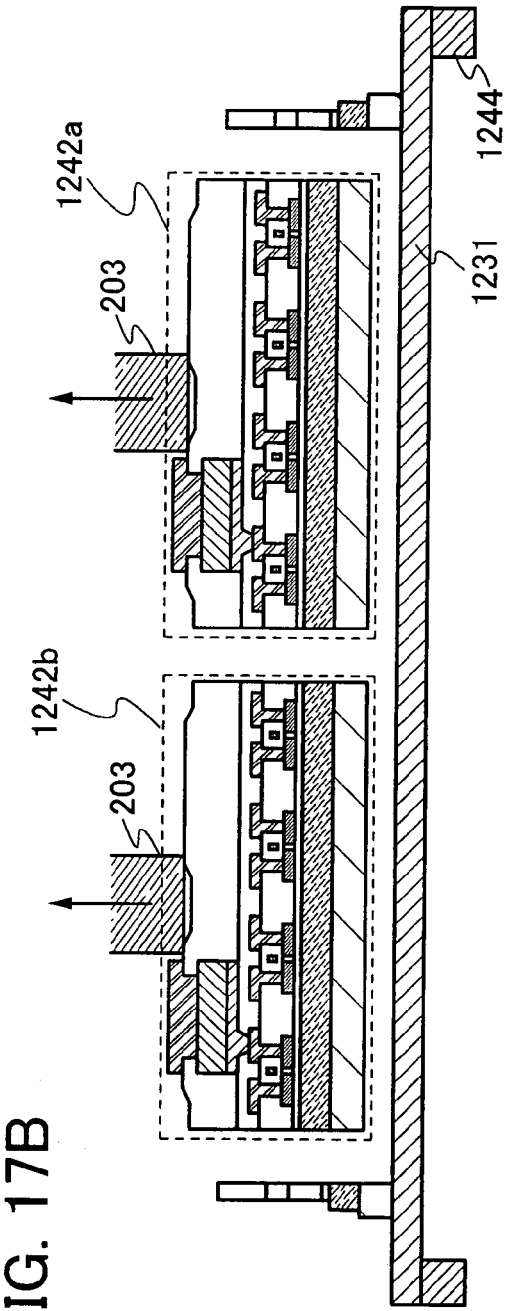
FIG. 17A
FIG. 17B

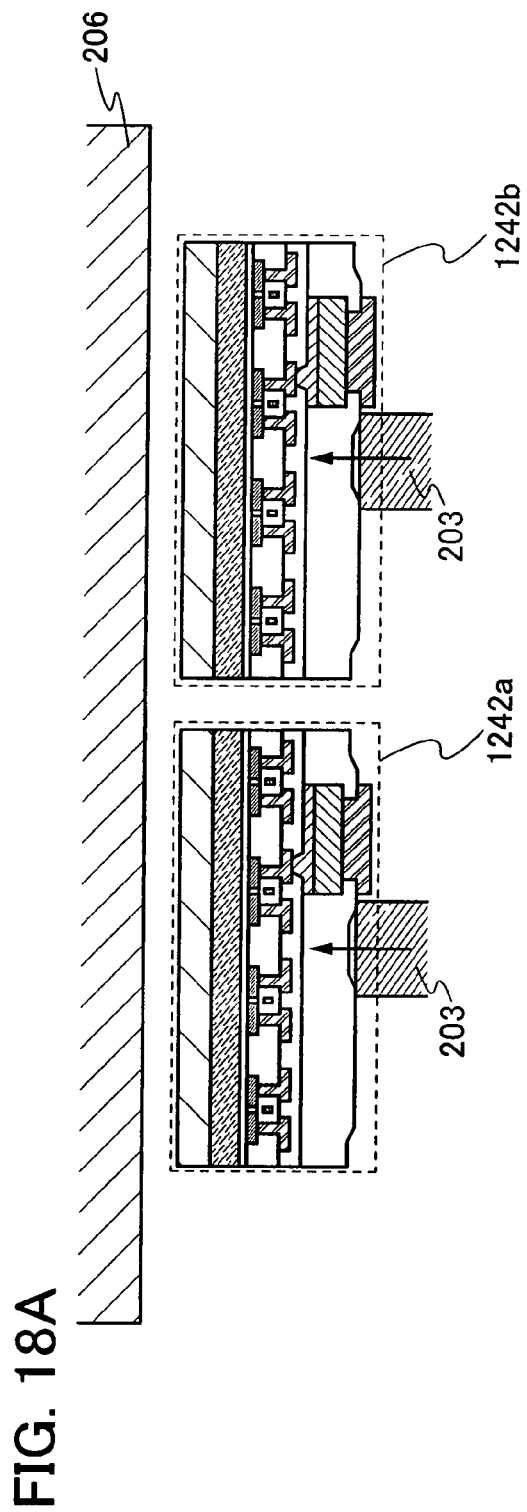
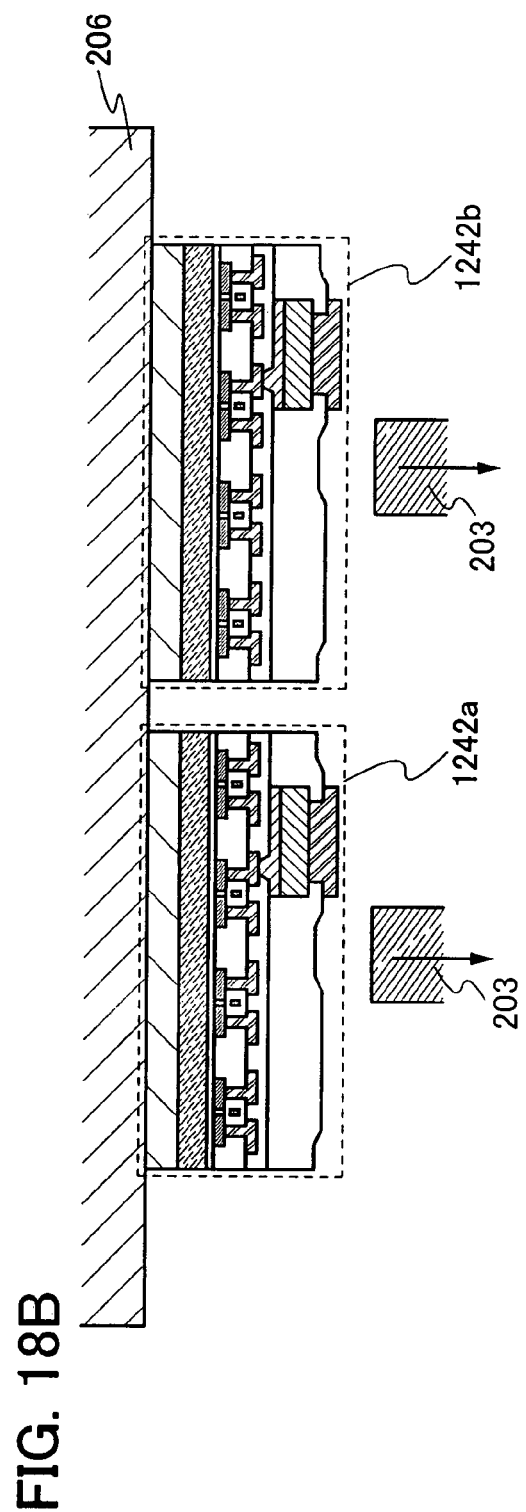

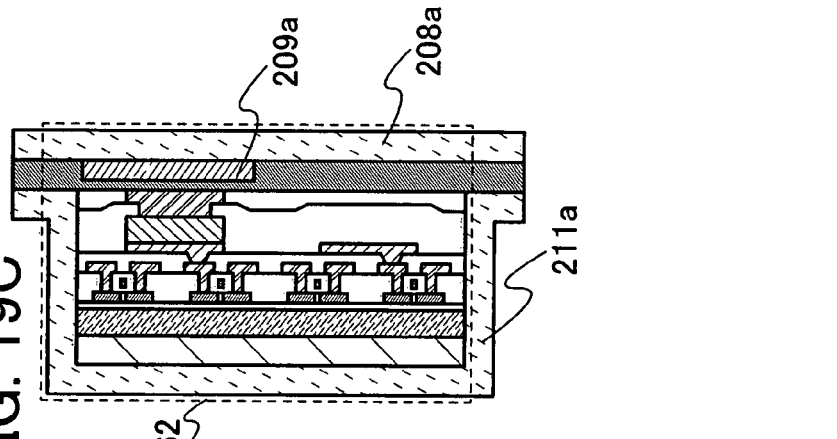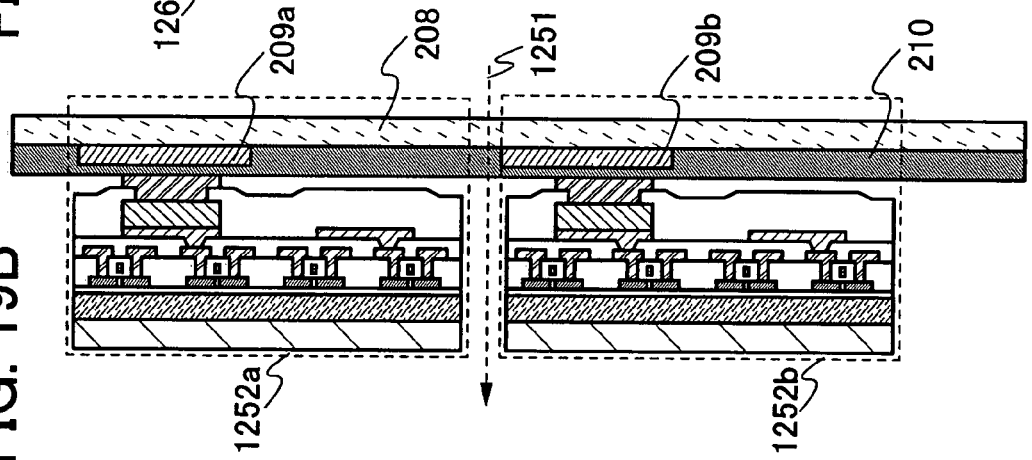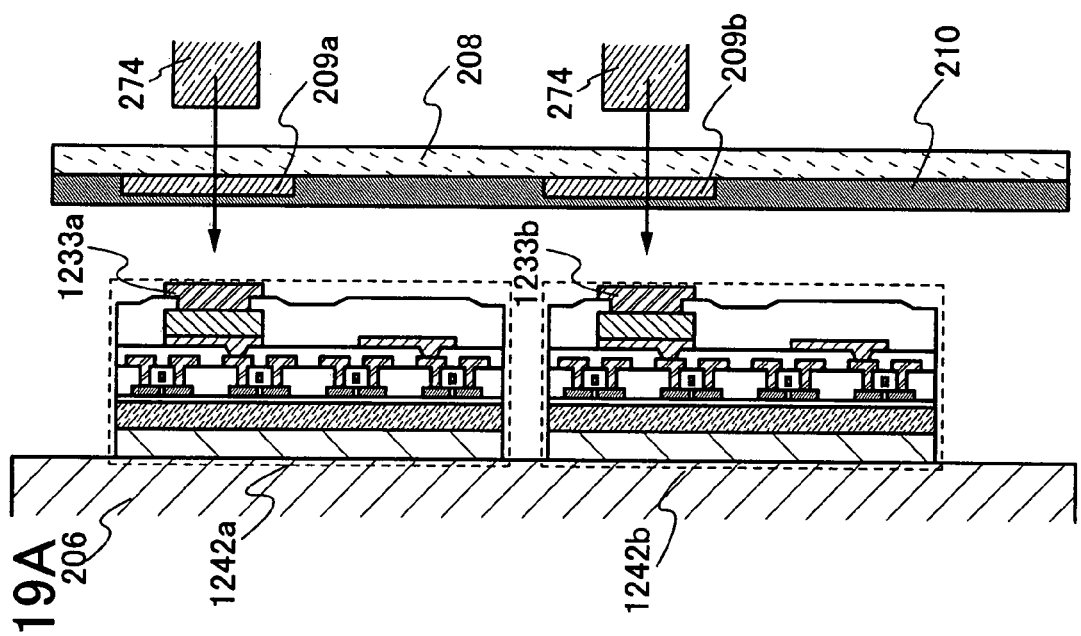

ATTACHMENT METHOD, ATTACHMENT APPARATUS, MANUFACTURING METHOD OF SEMICONDUCTOR DEVICE, AND MANUFACTURING APPARATUS OF SEMICONDUCTOR DEVICE

BACKGROUND OF THE INVENTION

1. Field of the Invention

The present invention relates to a manufacturing method of a semiconductor device, in which a semiconductor integrated circuit is electrically connected to a circuit (or an element) provided over a flexible substrate (a substrate having flexibility). The present invention particularly relates to a manufacturing method of a semiconductor device using a roll-to-roll method. The present invention relates to a manufacturing method of a semiconductor device, in which a semiconductor integrated circuit is electrically connected to an antenna formed over a flexible substrate. The present invention relates to a manufacturing method of a semiconductor device which performs data input and output by wireless communication via an antenna. The present invention also relates to a manufacturing apparatus of a semiconductor device.

2. Description of the Related Art

A semiconductor device including an antenna and a semiconductor integrated circuit electrically connected to the antenna has attracted attention as an RFID tag. The RFID tag is also called an IC tag, an ID tag, a transponder, an IC chip, or an ID chip. A manufacturing method of an RFID tag has been proposed, in which a plurality of antennas are provided over a flexible substrate and a plurality of semiconductor integrated circuits are electrically connected to the respective antennas one by one (see Reference 1: Japanese Published Patent Application No. 2005-115646).

In addition, a method has been proposed, in which a plurality of semiconductor integrated circuits are formed over a substrate (hereinafter also referred to as an element substrate), the semiconductor integrated circuits are taken out one by one and mounted over a substrate that is different from the element substrate (see Reference 2: Japanese Published Patent Application No. 2000-299598).

SUMMARY OF THE INVENTION

Takt time can be shortened when semiconductor integrated circuits arranged over a first flexible substrate are directly connected to antennas arranged over a second flexible substrate without rearrangement.

However, it is preferable that a plurality of semiconductor integrated circuits are formed over an element substrate with a higher degree of integration in order to reduce cost. It is also preferable that the area of the semiconductor integrated circuit is small. On the other hand, the antenna needs to have a predetermined shape and size to receive an electromagnetic wave of a predetermined frequency. Therefore, the semiconductor integrated circuit and the antenna have different sizes and different densities of arrangement. In this case, it has been impossible to electrically connect a plurality of semiconductor integrated circuits formed over an element substrate to a plurality of antennas over a flexible substrate simultaneously, without rearrangement.

Therefore, with the use of, for example, the method disclosed by Reference 2, the operation of taking out one of a plurality of semiconductor integrated circuits formed over an element substrate and connecting the semiconductor integrated circuit to one of a plurality of antennas over a flexible substrate has needed to be repeated for all of the semiconductor integrated circuits formed over the element substrate. This leads to long takt time and high manufacturing cost of a semiconductor device.

In view of the above-mentioned situation, the present invention proposes a method and an apparatus for attaching a plurality of components having different arrangement densities or arrangement intervals, which can achieve shorter takt time. It is an object of the present invention to provide a low-cost manufacturing method of a semiconductor device and a manufacturing apparatus capable of manufacturing a semiconductor device at low cost.

A feature of the present invention is to simultaneously attach plural pairs of components having different arrangement densities by temporarily attaching first components to a first flexible substrate while changing an arrangement interval in an X direction, and then connecting the first components to second components over a second flexible substrate while changing an arrangement interval of the first components in a Y direction.

A typical feature is to sequentially attach plural pairs of components having different arrangement densities by arranging a plurality of first components in a matrix over a support unit so as to have an interval x (x>0) in an X direction and an interval y (y>0) in a Y direction, temporarily attaching the first components to a first flexible substrate while changing the arrangement interval in the X direction from x to a, and connecting the first components to second components over a second flexible substrate while changing the arrangement interval in the Y direction from y to b.

Note that the interval a can be controlled by each rotation speed of a roll which supplies the first flexible substrate and a roll which recovers the first flexible substrate, and the cycle of temporarily attaching the first components to the first flexible substrate with pressure. The interval b can be controlled by each rotation speed of the roll which supplies the first flexible substrate, the roll which recovers the first flexible substrate, a roll which supplies the second flexible substrate, and a roll which recovers the second flexible substrate, and the cycle of temporarily attaching the first components to the second components.

An angle $\theta$ made by the X direction and the Y direction is greater than 0° and less than 180°. Alternatively, the angle $\theta$ may be 90°. Still alternatively, the angle made by the X direction and the Y direction may be 90°, and the first flexible substrate and the second flexible substrate may face each other and an angle made by longer sides of the first flexible substrate and the second flexible substrate may be greater than 0° and less than 90° or greater than 90° and less than 180°.

The first flexible substrate and the second flexible substrate may have the same width. Alternatively, these substrates may have different widths.

A feature of a manufacturing method of a semiconductor device according to one aspect of the present invention is as follows. A plurality of semiconductor integrated circuits are arranged in a matrix over a support unit so as to have a row interval of x (x>0) and a column interval of y (y>0). The plurality of semiconductor integrated circuits are temporarily attached to the first flexible substrate row by row while changing the row interval to a (a>x) without changing the column interval. A plurality of antennas are arranged in a matrix so as to have a column interval of a and a row interval of b (b>y) over a second flexible substrate. The second flexible substrate is moved in a row direction of the plurality of antennas so as to intersect with the row direction of the plurality of semiconductor integrated circuits over the first flexible substrate, and each of the plurality of semiconductor integrated circuits temporarily attached to the first flexible substrate is connected to one of the plurality of antennas.

Note that in addition to the movement of the second flexible substrate in the row direction of the plurality of antennas, the first flexible substrate may be moved in the row direction of the plurality of semiconductor integrated circuits so as to intersect with the row direction of the plurality of antennas. In this manner, each of the plurality of semiconductor integrated circuits temporarily attached to the first flexible substrate may be connected to one of the plurality of antennas.

Another feature of the manufacturing method of a semiconductor device of the present invention is as follows. A plurality of semiconductor integrated circuits are arranged in a matrix with m (m is a natural number) rows and n (n is a natural number) columns over a support unit so as to have a row interval of x (x>0) and a column interval of y (y>0). The plurality of semiconductor integrated circuits are temporarily attached to a first flexible substrate row by row while changing the row interval to a (a>x) without changing the column interval. A plurality of antennas are arranged in a matrix with q (q is a natural number equal to or greater than p) rows and p (p is a natural number) columns over a second flexible substrate so as to have a column interval of a and a row interval of b (b>y) and arrange connection portions on a line parallel to the row direction. Semiconductor integrated circuits of the j-th (j is a natural number equal to or greater than 1 and equal to or less than p) column among the plurality of semiconductor integrated circuits temporarily attached to the first flexible substrate are connected to connection portions of antennas of the j-th row among the plurality of antennas.

In particular, semiconductor integrated circuit in the i-th (i is a natural number equal to or greater than 1 and equal to or less than p) row and the j-th (j is a natural number equal to or greater than 1 and less than q) column among the plurality of semiconductor integrated circuits temporarily attached to the first flexible substrate may be connected to connection portion of antenna in the j-th row and the i-th column among the plurality of antennas. After the semiconductor integrated circuits are electrically connected to the connection portions of all of the antennas of the j-th row among the plurality of antennas, the second flexible substrate is moved in the row direction of the plurality of antennas. Then, semiconductor integrated circuit in the i-th row and the (j+1)-th column among the plurality of semiconductor integrated circuits temporarily attached to the first flexible substrate is connected to connection portion of antenna in the (j+1)-th row and the i-th column among the plurality of antennas.

Another feature of the manufacturing method of a semiconductor device of the present invention is as follows. A plurality of semiconductor integrated circuits are arranged in a matrix with m (m is a natural number) rows and n (n is a natural number) columns over a support unit so as to have a row interval of x (x>0) and a column interval of y (y>0). The plurality of semiconductor integrated circuits are temporarily attached to a first flexible substrate row by row while changing the row interval to a (a>x) without changing the column interval. A plurality of antennas are arranged in a matrix with q (q is a natural number equal to or greater than p) rows and p (p is a natural number equal to or less than m) columns over a second flexible substrate so as to have a column interval of a and a row interval of b (b>y) and arrange connection portions on a line having an angle of arc tan(y/a) to the column direction. Alternatively, the first flexible substrate and the second flexible substrate are arranged so that these substrates face each other and longer sides thereof intersect with each other at an angle of arc tan(y/a). Semiconductor integrated circuits of the j-th (j is a natural number equal to or greater than 1 and equal to or less than p) column among the plurality of semiconductor integrated circuits temporarily attached to the first flexible substrate are connected to connection portions of antennas of the j-th row among the plurality of antennas.

In particular, semiconductor integrated circuit in the i-th (i is a natural number equal to or greater than 1 and less than p) row and the j-th (j is a natural number equal to or greater than 1 and less than q) column among the plurality of semiconductor integrated circuits temporarily attached to the first flexible substrate may be connected to connection portion of antenna in the j-th row and the i-th column among the plurality of antennas. After the semiconductor integrated circuits are connected to the connection portions of all of the antennas of the j-th row among the plurality of antennas, the first flexible substrate is moved in the row direction of the plurality of semiconductor integrated circuits and the second flexible substrate is moved in the row direction of the plurality of antennas perpendicularly to the row direction of the plurality of semiconductor integrated circuits. Then, semiconductor integrated circuit in the (i+1)-th row and the j-th column among the plurality of semiconductor integrated circuits temporarily attached to the first flexible substrate is connected to connection portion of antenna in the (j+1)-th row and the i-th column among the plurality of antennas.

Note that a plurality of semiconductor integrated circuits temporarily attached to the first flexible substrate may be connected to antennas of one row among the plurality of antennas simultaneously or sequentially.

In the step of connecting the plurality of semiconductor integrated circuits temporarily attached to the first flexible substrate to the plurality of antennas, the semiconductor integrated circuits may be electrically connected to the antennas. After the plurality of semiconductor integrated circuits temporarily attached to the first flexible substrate are temporarily connected to the plurality of antennas, the plurality of antennas and the plurality of semiconductor integrated circuits temporarily attached to the first flexible substrate may be electrically and permanently connected to each other by pressure bonding, heating, or the like. The step of pressure bonding, heating, or the like which is carried out after the plurality of semiconductor integrated circuits temporarily attached to the first flexible substrate are temporarily connected to the plurality of antennas can be simultaneously carried out to all of the antennas arranged over the second flexible substrate.

A feature of an attachment apparatus according to one aspect of the present invention is to include a pickup unit, a first substrate transport unit, a second substrate transport unit, a control unit, and a bonding unit. The pickup unit temporarily attaches a plurality of first components arranged over a support unit to a first flexible substrate row by row while changing an interval in an X direction of the plurality of first components from x to a. The first substrate transport unit moves the first flexible substrate in the X direction of the plurality of first components over the first flexible substrate. The second substrate transport unit moves a second flexible substrate, over which a plurality of second components are arranged in a matrix, in a Y direction of the plurality of first components. The control unit controls the pickup unit, the first substrate transport unit, the bonding unit, and the second substrate transport unit so that each of the plurality of first components temporarily attached to the first flexible substrate is overlapped with one of the plurality of second components. The bonding unit connects the plurality of second components overlapping the plurality of first components to the plurality of first components.

A feature of a manufacturing apparatus of a semiconductor device according to one aspect of the present invention is to include a pickup unit, a first substrate transport unit, a second substrate transport unit, a control unit, and a bonding unit. The pickup unit temporarily attaches a plurality of semiconductor integrated circuits arranged in a matrix over a support unit to a first flexible substrate row by row. The first substrate transport unit moves the first flexible substrate in a row direction of the plurality of semiconductor integrated circuits over the first flexible substrate. The second substrate transport unit moves a second flexible substrate, over which a plurality of antennas are arranged in a matrix, in a row direction of the plurality of antennas and in a direction intersecting with the direction of movement of the first flexible substrate. The control unit controls the pickup unit, the first substrate transport unit, the bonding unit, and the second substrate transport unit so that each of the plurality of semiconductor integrated circuits temporarily attached to the first flexible substrate is overlapped with one of connection portions of the plurality of antennas. The bonding unit connects the plurality of semiconductor integrated circuits overlapping the connection portions of the plurality of antennas to the connection portions of the antennas.

Note that the bonding unit may simultaneously or sequentially connect a plurality of semiconductor integrated circuits temporarily attached to the first flexible substrate to antennas of one row among the plurality of antennas.

Alternatively, the bonding unit may electrically connect the antennas and the semiconductor integrated circuits. Still alternatively, the bonding unit may include a first structure which temporarily connects the plurality of semiconductor integrated circuits temporarily attached to the first flexible substrate to the plurality of antennas, and a second structure which electrically and permanently connects the plurality of antennas and the plurality of semiconductor integrated circuits temporarily attached to the first flexible substrate to each other by pressure bonding, heating, or the like.

According to an attachment method of the present invention, components having different arrangement densities can be sequentially attached to each other by temporarily attaching first components to a first flexible substrate while changing an arrangement interval in an X direction, and then connecting the first components to second components over a second flexible substrate while changing an arrangement interval in a Y direction of the first components. Typically, components having different arrangement densities can be sequentially attached to each other by arranging a plurality of first components in a matrix so as to have an interval x (x>0) in an X direction and an interval y (y>0) in a Y direction, temporarily attaching the first components to a first flexible substrate while changing the arrangement interval in the X direction from x to a, and connecting the first components to second components over a second flexible substrate while changing the arrangement interval in the Y direction from y to b. In addition, plural pairs of components can be attached to each other simultaneously. Therefore, takt time for the attachment step can be shortened.

According to the manufacturing method of a semiconductor device of the present invention, a plurality of semiconductor integrated circuits arranged in a matrix over a support unit are temporarily attached to a first flexible substrate with a row interval increased. Therefore, the row interval of the plurality of semiconductor integrated circuits over the first flexible substrate can be changed to match the column interval of a plurality of antennas over a second flexible substrate. Then, the second flexible substrate is moved in a row direction of the plurality of antennas perpendicularly to a row direction of the plurality of semiconductor integrated circuits over the first flexible substrate. In this manner, each row of the plurality of semiconductor integrated circuits temporarily attached to the first flexible substrate can be made to correspond to a column of the plurality of antennas. Therefore, a plurality of semiconductor integrated circuits corresponding to one row of the plurality of antennas can be aligned with the row at the same time. The second flexible substrate is moved with respect to the first flexible substrate in this manner, and each of the plurality of semiconductor integrated circuits temporarily attached to the first flexible substrate is connected to one of the plurality of antennas. In this manner, antennas of one row among the plurality of antennas and a plurality of semiconductor integrated circuits corresponding to the row among the plurality of semiconductor integrated circuits temporarily attached to the first flexible substrate can be connected to each other simultaneously or sequentially.

Alternatively, in addition to the movement of the second flexible substrate in the row direction of the plurality of antennas, the first flexible substrate may be moved in the row direction of the plurality of semiconductor integrated circuits perpendicularly to the row direction of the plurality of antennas. In this manner, even in a case where the number of rows of the plurality of semiconductor integrated circuits arranged over a support unit is greater than the number of columns of the plurality of antennas over the second flexible substrate, each row of the plurality of semiconductor integrated circuits can be arranged to correspond to a column of the plurality of antennas.

In particular, the plurality of antennas are arranged over the second flexible substrate so as to have the column interval of a and the row interval of b and arrange connection portions thereof on a line parallel to the row direction. Then, semiconductor integrated circuits of the j-th column among the plurality of semiconductor integrated circuits temporarily attached to the first flexible substrate are connected to connection portions of antennas of the j-th row among the plurality of antennas. In this manner, each semiconductor integrated circuit can be arranged to correspond to an antenna, and antennas of one row among the plurality of antennas and semiconductor integrated circuits of one column among the plurality of semiconductor integrated circuits temporarily attached to the first flexible substrate can be connected to each other simultaneously or sequentially.

Alternatively, semiconductor integrated circuit in the i-th row and the j-th column among the plurality of semiconductor integrated circuits temporarily attached to the first flexible substrate may be connected to connection portion of antenna in the j-th row and the i-th column among the plurality of antennas. After semiconductor integrated circuits are connected to the connection portions of all of the antennas of the j-th row among the plurality of antennas, the second flexible substrate is moved in the row direction of the plurality of antennas. Then, semiconductor integrated circuit in the i-th row and the (j+1)-th column among the plurality of semiconductor integrated circuits temporarily attached to the first flexible substrate is connected to connection portion of antenna in the (j+1)-th row and the i-th column among the plurality of antennas. Thus, semiconductor integrated circuits can be connected to antennas of each row among the plurality of antennas.

In particular, the plurality of antennas are arranged over the second flexible substrate so as to have a column interval of a and a row interval of b and arrange connection portions thereof on a line having an angle of arc tan(y/a) to the row direction. Then, semiconductor integrated circuits arranged on a diagonal line among the plurality of semiconductor integrated circuits temporarily attached to the first flexible substrate are connected to the connection portions of antennas of the j-th row among the plurality of antennas. In this manner, each semiconductor integrated circuit can be arranged to correspond to an antenna, and antennas of one row among the plurality of antennas and the semiconductor integrated circuits arranged on a line having an angle of arc tan(y/a) over the first flexible substrate can be connected to each other simultaneously or sequentially.

Alternatively, the semiconductor integrated circuit in the i-th row and the j-th column among the plurality of semiconductor integrated circuits temporarily attached to the first flexible substrate may be connected to the connection portion of the antenna in the j-th row and the i-th column among the plurality of antennas. After the semiconductor integrated circuits are connected to the connection portions of all of the antennas of the j-th row among the plurality of antennas, the first flexible substrate is moved in the row direction of the plurality of semiconductor integrated circuits, and the second flexible substrate is moved in the row direction of the plurality of antennas perpendicularly to the row direction of the plurality of semiconductor integrated circuits. Then, a semiconductor integrated circuit in the (i+1)-th row and the j-th column among the plurality of semiconductor integrated circuits temporarily attached to the first flexible substrate is connected to a connection portion of an antenna in the (j+1)-th row and the i-th column among the plurality of antennas. Thus, the semiconductor integrated circuits can be connected to the antennas of each column among the plurality of antennas.

The step of connecting the antennas to the plurality of semiconductor integrated circuits temporarily attached to the first flexible substrate may be divided into two steps: a step of temporarily connecting the plurality of semiconductor integrated circuits temporarily attached to the first flexible substrate to the plurality of antennas (the step is hereinafter referred to as temporary connection) and a step of electrically connecting the plurality of antennas and the plurality of semiconductor integrated circuits temporarily attached to the first flexible substrate to each other by pressure bonding, heating, or the like (the step is hereinafter referred to as permanent connection). It is less necessary to control conditions of pressure or heating for temporary connection than for permanent connection; thus, alignment accuracy is more easily improved. In this manner, the plurality of semiconductor integrated circuits temporarily attached to the first flexible substrate can be connected to the plurality of antennas with high accuracy, and the antennas and the semiconductor integrated circuits can be electrically connected to each other more securely.

Accordingly, takt time can be shortened, mass productivity can be improved, and a low-cost manufacturing method of a semiconductor device can be provided.

A manufacturing apparatus of a semiconductor device of the present invention includes a pickup unit, a first substrate transport unit, a second substrate transport unit, a control unit, and a bonding unit. The pickup unit temporarily attaches a plurality of semiconductor integrated circuits arranged in a matrix over a support unit to a first flexible substrate row by row. The first substrate transport unit moves a second flexible substrate, over which a plurality of antennas are arranged in a matrix, in a row direction of the plurality of antennas and in a direction intersecting with the direction of movement of the first flexible substrate. The second substrate transport unit moves the first flexible substrate perpendicularly to a row direction of the plurality of semiconductor integrated circuits over the first flexible substrate. The control unit controls the pickup unit, the first substrate transport unit, the bonding unit, and the second substrate transport unit so that each of the plurality of semiconductor integrated circuits temporarily attached to the first flexible substrate is overlapped with one of connection portions of the plurality of antennas. The bonding unit connects the plurality of semiconductor integrated circuits overlapping the connection portions of the plurality of antennas to the connection portions of the antennas. In this manner, the antennas of one row among the plurality of antennas and a plurality of semiconductor integrated circuits corresponding to the row among the plurality of semiconductor integrated circuits temporarily attached to the first flexible substrate can be connected to each other simultaneously or sequentially.

The bonding unit may include a structure which carries out permanent attachment in addition to a structure which carries out temporary attachment. In this manner, the plurality of semiconductor integrated circuits temporarily attached to the first flexible substrate can be connected to the plurality of antennas with high accuracy, and the antennas and the semiconductor integrated circuits can be electrically connected to each other more securely.

Accordingly, takt time can be shortened, pass productivity can be improved, and a manufacturing apparatus which can manufacture a semiconductor device at low cost can be provided.

BRIEF DESCRIPTION OF DRAWINGS

FIG. 11 is a top view illustrating a manufacturing method of a semiconductor device of the present invention.

FIGS. 17A and 17B are cross-sectional views illustrating a manufacturing process of a semiconductor device of the present invention.

FIGS. 18A and 18B are cross-sectional views illustrating a manufacturing process of a semiconductor device of the present invention.

FIGS. 19A to 19C are cross-sectional views illustrating a manufacturing process of a semiconductor device of the present invention.

DETAILED DESCRIPTION OF THE INVENTION

Figure 1A:
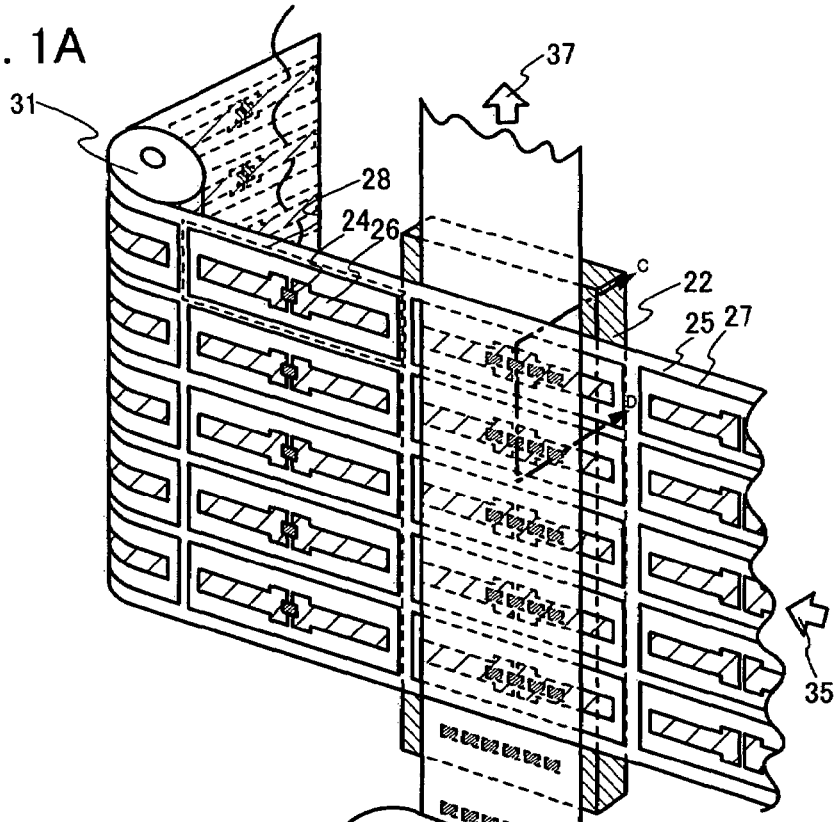
FIG. 1A is a perspective view and FIGS. 1B and 1C are cross-sectional views illustrating a manufacturing apparatus of a semiconductor device of the present invention.

Embodiment modes and embodiments of the present invention will be described in detail with reference to the accompanying drawings. Note that the present invention is not limited to the following description. It is easily understood by a person skilled in the art that the mode and the detail of the present invention can be variously changed without departing from the spirit and the scope of the present invention. Therefore, the present invention should not be interpreted as being limited to the following description. Note that in the structures of the present invention described below, the same reference numeral is commonly used to denote the same components in different drawings.

Embodiment Mode 1

A manufacturing method of a semiconductor device of the present invention is described. The description is given with reference to FIGS. 1A to 10.

Figure 1B:
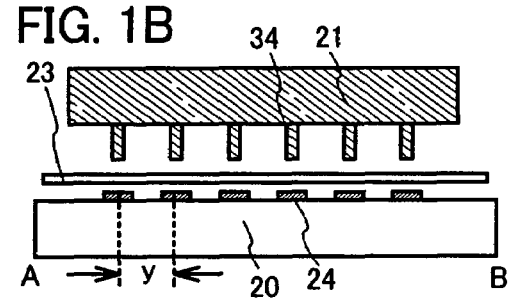
Figure 1C:
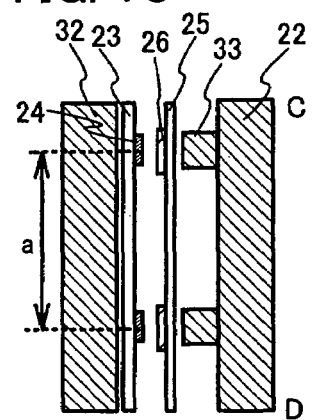

FIGS. 1A to 1C show modes of an attachment apparatus and a manufacturing apparatus of a semiconductor device of the present invention. The attachment apparatus includes a support unit over which first components are arranged, a first flexible substrate for holding the first components, and a pickup unit for temporarily attaching the first components arranged over the support unit to the first flexible substrate. In addition, the attachment apparatus includes a second flexible substrate over which second components are arranged, and a bonding unit for connecting the first components to the second components. Further, the attachment apparatus includes a first substrate transport unit having a first supply portion for supplying (feeding) the first flexible substrate and a first recovery portion for recovering (taking up) the first flexible substrate. Furthermore, the attachment apparatus includes a second substrate transport unit having a second supply portion for supplying (feeding) the second flexible substrate and a second recovery portion for recovering (taking up) the second flexible substrate. The timing and speed of movement of the second flexible substrate can be controlled by the operation of the second supply portion, the operation of the second recovery portion, and the rotation speed of a roller.

Hereinafter described is a mode of a manufacturing apparatus of a semiconductor device using a semiconductor integrated circuit as the first component and an antenna as the second component. Note that instead of the semiconductor integrated circuit, an antenna, a second semiconductor integrated circuit, a sensor, a battery, a wiring board, a display device, a microelectromechanical system (MEMS), or the like can be used appropriately as the first component. Instead of the antenna, a semiconductor integrated circuit, a sensor, a battery, a wiring board, a display device, a MEMS, or the like can be used appropriately as the second component.

The manufacturing apparatus of a semiconductor device includes a support unit 20 over which semiconductor integrated circuits 24 are arranged, a first flexible substrate 23 for holding the semiconductor integrated circuit 24, and a pickup unit 21 for temporarily attaching the semiconductor integrated circuits 24 arranged over the support unit 20 to the first flexible substrate 23. In addition, it includes a second flexible substrate 25 over which the antennas 26 are formed, and a bonding unit 22 for connecting the semiconductor integrated circuits 24 to the antennas 26. Further, it may include a roller 30 for controlling the movement of the first flexible substrate 23, and a roller 31 for controlling the movement of the second flexible substrate 25.

FIG. 1B shows a cross-sectional view taken along a line A-B of FIG. 1A. Note that A-B in FIGS. 1A and 1B is along a column direction of the semiconductor integrated circuits. As FIG. 1B shows one mode, the first flexible substrate 23 is disposed at a constant distance over the semiconductor integrated circuits 24 over the support unit 20. In addition, the pickup unit 21 is disposed at a certain distance over the first flexible substrate 23. The pickup unit 21 includes a pressing portion 34. Alternatively, the positions of the support unit 20 and the pickup unit 21 may be interchanged with respect to the first flexible substrate 23 and the semiconductor integrated circuits 24.

FIG. 1C shows a cross-sectional view taken along a line C-D of FIG. 1A. Note that C-D in FIG. 1A is along a column direction of the antennas. The interval between each row of the antennas is a. As FIG. 1C shows one mode, the antennas 26 over the second flexible substrate 25 face the semiconductor integrated circuits 24 over the first flexible substrate 23 with a certain distance therebetween. In addition, the bonding unit 22 is disposed at a certain distance from the second flexible substrate 25. The bonding unit 22 includes a pressing portion 33. Further, a substrate 32 may be provided opposite to the bonding unit 22 relative to the first flexible substrate 23 and the second flexible substrate 25 in order to promote the connection of the semiconductor integrated circuits 24 over the first flexible substrate 23 and the antennas 26 over the second flexible substrate 25, that is, in order to facilitate pressing by the bonding unit 22. Alternatively, the positions of the substrate 32 and the bonding unit 22 may be interchanged with respect to the first flexible substrate 23 and the second flexible substrate 25.

Although not shown, the manufacturing apparatus of a semiconductor device includes a first substrate transport unit having a first supply portion for supplying (feeding) the first flexible substrate 23 and a first recovery portion for recovering (taking up) the first flexible substrate 23. The timing of feeding and the speed of movement of the first flexible substrate 23 can be controlled by the operation of the first supply portion, the operation of the first recovery portion, and the rotation speed of the roller 30. In addition, the manufacturing apparatus of a semiconductor device includes a second substrate transport unit having a second supply portion for supplying (feeding) the second flexible substrate 25 and a second recovery portion for recovering (taking up) the second flexible substrate 25. The timing and the speed of movement of the second flexible substrate 25 can be controlled by the operation of the second supply portion, the operation of the second recovery portion, and the rotation speed of the roller 31.

In addition, the manufacturing apparatus of a semiconductor device includes a control device for controlling the operations of the support unit 20, the pickup unit 21, the bonding unit 22, the first substrate transport unit, the second substrate transport unit, the rollers 30 and 31, and the like.

Figure 2A:
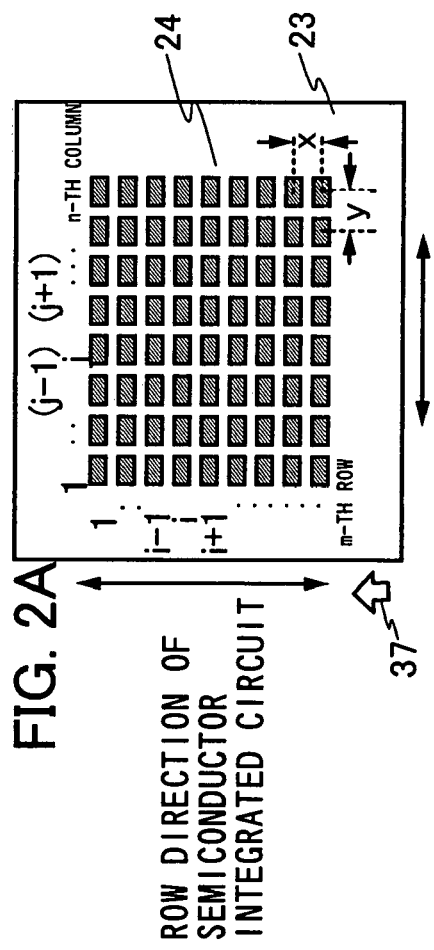
FIGS. 2A and 2B are top views illustrating a semiconductor integrated circuit and an antenna which can be used in the present invention, respectively.

In the manufacturing apparatus of a semiconductor device of the present invention, the semiconductor integrated circuits 24 are arranged in a matrix with m rows and n columns over the support unit 20, as one mode of which is shown in FIG. 2A. At this time, a row interval of the semiconductor integrated circuits is x and a column interval is y. Note that each of the row interval and the column interval of the semiconductor integrated circuits here is a distance between centers of adjacent semiconductor integrated circuits. Further, a direction parallel to an arrow 37, in which the first flexible substrate 23 moves, is set to the row direction of the semiconductor integrated circuits arranged in a matrix. Each semiconductor integrated circuit is preferably provided with an alignment mark.

Figure 2B:
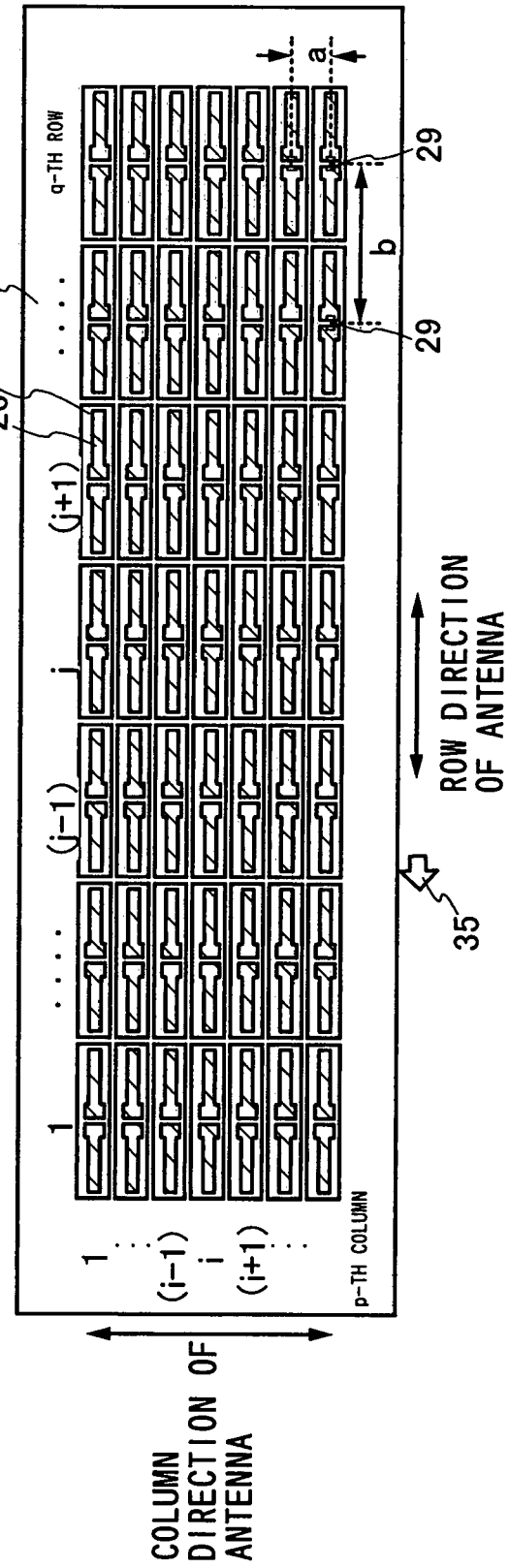

In the manufacturing apparatus of a semiconductor device of the present invention, the antennas 26 are arranged in a matrix with q rows and p columns over the second flexible substrate 25, as one mode of which is shown in FIG. 2B. At this time, a row interval of connection portions 29 of adjacent antennas is b and a column interval thereof is a. Note that each of the row interval and the column interval of the connection portions of the antennas here is a distance between centers of connection portions of adjacent antennas. Further, a direction parallel to an arrow 35, in which the second flexible substrate 25 moves, is set to the row direction of the antennas arranged in a matrix. Each antenna is preferably provided with an alignment mark. Alternatively, the second flexible substrate is preferably provided with an alignment mark. The antennas and the semiconductor integrated circuits can be connected to each other with high yield by alignment of the alignment marks with each other.

Note that described here is a mode in which the connection portion 29 of the antenna 26 has a similar area to that of the semiconductor integrated circuit 24. Alternatively, the area of the connection portion 29 of the antenna 26 may be different from that of the semiconductor integrated circuit 24. In other words, it is acceptable as long as a connection terminal of the semiconductor integrated circuit 24 is electrically connected to the antenna 26, although there is a case where the connection portion 29 of the antenna 26 is not completely overlapped with and is slightly misaligned with the semiconductor integrated circuit 24 depending on the alignment accuracy of the manufacturing apparatus of a semiconductor device.

An example of the support unit 20 is a stage, a tray, an expanding ring on which a UV sheet is stretched, or the like over which the semiconductor integrated circuits 24 are mounted. The support unit 20 may be provided in a moving apparatus. An example of the moving apparatus is a belt conveyer capable of horizontal movement (in the xy direction), a robot arm or a stage capable of up and down and horizontal movement (in the xyz direction), or the like.

The pickup unit 21 includes the pressing portion 34. The pickup unit 21 is connected to a moving apparatus such as a robot arm, a head, or a roller. When such a moving apparatus is provided, the up and down and horizontal movement (in the xyz direction) of the pickup unit can be performed freely. The pickup unit 21 can attach the first flexible substrate 23 and the semiconductor integrated circuits 24 to each other with pressure and move the semiconductor integrated circuits 24 from the support unit 20 to the first flexible substrate 23. The pressing portion 34 may be provided for each semiconductor integrated circuit. Alternatively, a single pressing portion 34 may be provided for the entire region to be pressed. Described here is a mode in which the pressing portion 34 is provided for each semiconductor integrated circuit. Note that the pressing portion 34 can preferably apply a load of 10 g to 100 kg, more preferably 50 g to 50 kg.

The semiconductor integrated circuit 24 is formed using a plurality of semiconductor elements, and is typically a silicon chip including a plurality of semiconductor elements, a chip including a plurality of thin-film semiconductor elements, or the like.

The silicon chip including a plurality of semiconductor elements is typically manufactured by the following method. MOS transistors, capacitors, resistors, diodes, or the like are formed on the surface of a silicon wafer. Next, the backside of the silicon wafer is subjected to polishing treatment called backgrinding to make the thickness of the silicon wafer 30 μm to 250 μm, preferably 50 μm to 100 μm. Then, the silicon wafer is divided into rectangles by a dicer. Thus, the silicon chip is manufactured.

A typical example of the chip including a plurality of thin-film semiconductor elements is a layer including thin-film transistors, capacitors, resistors, thin-film diodes, or the like. The chip including a plurality of thin-film semiconductor elements is typically manufactured by forming a layer which includes thin-film transistors, capacitors, resistors, thin-film diodes, or the like over a substrate, peeling the layer from the substrate, and dividing the layer into rectangles.

The first flexible substrate 23 is preferably a flexible substrate having an adhesive layer over its surface (hereinafter also referred to as a film having an adhesive layer) to hold the semiconductor integrated circuits 24 over the surface. An example of the film having an adhesive layer is a UV-curable adhesive film (also referred to as a UV film, a UV tape, or a UV sheet), a pressure-sensitive film which changes its adhesion when subjected to pressure (also referred to as a pressure-sensitive tape or a pressure-sensitive sheet), a thermosetting adhesive film (also referred to as a thermosetting adhesive tape or a thermosetting adhesive sheet), or the like. Alternatively, the film having an adhesive layer may be of stretchable expand type.

On the other hand, a flexible substrate is used as the second flexible substrate 25. Further, the second flexible substrate 25 may be provided with an adhesive layer and release paper. In such a case, an adhesive layer and release paper are provided on a side opposite to the side on which the antennas are formed. A typical example of the flexible substrate is a substrate made of PET (polyethylene terephthalate), PEN (polyethylenenaphthalate), PES (polyethersulfone), polypropylene, polypropylene sulfide, polycarbonate, polyetherimide, polyphenylene sulfide, polyphenylene oxide, polysulfone, polyphthalamide, or the like. Another example is paper made of a fibrous material. Further, the flexible substrate can be provided with layers of an adhesive organic resin (such as an acrylic resin, an epoxy resin, or a silicone resin) that are stacked as layers made of a thermoplastic material, on a side opposite to the side on which the antennas are formed.

The bonding unit 22 is a unit for attaching the semiconductor integrated circuits 24 and the antennas 26 to each other with pressure by the pressing portion 33 to mount (permanently attach with pressure) the semiconductor integrated circuits 24 and the antennas 26. Note that the semiconductor integrated circuits 24 and the antennas 26 can be further securely connected to each other by providing a conductive paste between the semiconductor integrated circuits 24 and the antennas 26.

The bonding unit 22 may electrically connect the antennas and the semiconductor integrated circuits to each other by pressure bonding by the pressing portion 33 while heating the antennas and the semiconductor integrated circuits. In such a case, the pressing portion of the bonding unit 22 is provided with a pressure bonding unit and a heating unit. An example of such a bonding unit is that using a thermocompression bonding method or an ultrasonic bonding method, and typically the pressing portion can be provided with a heater or an ultrasonic horn. With such a structure, there is no necessity for additionally providing a large heater; therefore, the size of the manufacturing apparatus of a semiconductor device can be reduced.

In a case of using only a pressure bonding unit as the pressing portion 33 of the bonding unit 22, a heating unit for electrically connecting the connection portions of the antennas and the semiconductor integrated circuits is separately provided. An example of such a heating unit is a heater. With such a structure, the accuracy of alignment by the bonding unit can be improved, and attachment time can be shortened. As a result, the plurality of semiconductor integrated circuits which are temporarily attached to the first flexible substrate can be connected to the plurality of antennas by the bonding unit in a shorter time with high accuracy. In addition, the antennas and the semiconductor integrated circuits can be electrically connected to each other more securely by the separately-provided heating unit.

Note that the heating unit for connecting the antennas and the semiconductor integrated circuits is preferably a heater capable of heating to a temperature ranging from a room temperature to 500° C. The pressing portion 33 can preferably apply a load of 10 g to 100 kg, more preferably 50 g to 50 kg.

For the antenna 26, a conductive layer formed over a flexible substrate by a printing method, by etching a conductive thin film, by a plating method, or the like. The antenna 26 can be formed using a conductive layer including one or more elements of Ag, Au, Cu, Ni, Pt, Pd, Ir, Rh, W, Al, Ta, Mo, Cd, Zn, Fe, Ti, Zr, and Ba.

Figure 20A:
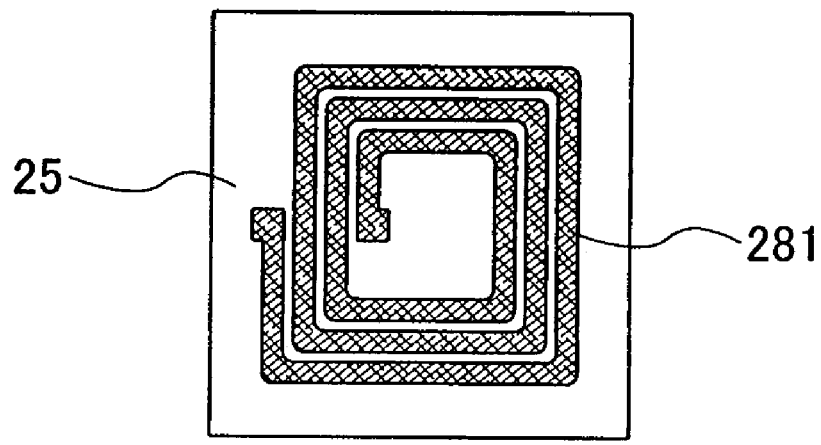
FIGS. 20A to 20C are top views each illustrating an antenna applicable to the present invention.
Figure 20B:
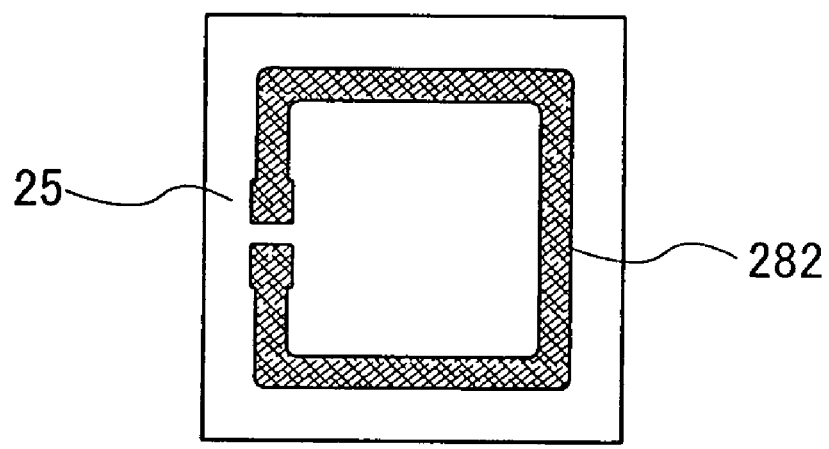
Figure 20C:

FIGS. 20A to 20C are top views of antennas which are applicable to the present invention. When adopting an electromagnetic coupling method or an electromagnetic induction method (e.g., 13.56 MHz) as a signal transmission method of a semiconductor device, a conductive layer functioning as an antenna can have a rectangular coil shape 281 as shown in FIG. 20A or a circular coil shape (e.g., a spiral antenna) to utilize electromagnetic induction which occurs due to a change in magnetic flux density. Alternatively, the conductive layer can have a rectangular loop shape 282 as shown in FIG. 20B or a circular loop shape.

When adopting a microwave method (e.g., a UHF band (860 to 960 MHz) or a 2.45 GHz), the shape (e.g., length) of the conductive layer functioning as an antenna may be appropriately set in consideration of the wavelength of an electromagnetic wave used for signal transmission, and the conductive layer can have a linear dipole shape 283 as shown in FIG. 20C, a curved dipole shape, or a plane shape (e.g., a patch antenna).

Although described here is the mode in which the antennas 26 are formed over the second flexible substrate 25, the present invention is not limited thereto. For example, a second semiconductor integrated circuit, a sensor, a battery, a wiring board, a display device, or the like can be used as appropriate, instead of the antenna 26.

Each of the rollers 30 and 31, the first supply portion, the second supply portion, the first recovery portion, and the second recovery portion is a cylindrical rotating body, and typically corresponds to a surface-polished cylindrical casting, plastic, or the like. Each of the rollers 30 and 31, the first supply portion, and the second supply portion rotates at a predetermined speed. The first supply portion, the roller 30, and the first recovery portion rotate in the same direction. The second supply portion, the roller 31, and the second recovery portion rotate in the same direction.

The substrate 32 is provided so that the bonding unit 22 easily applies a pressure when the semiconductor integrated circuits 24 and the antennas 26 are connected to each other using the bonding unit 22. Therefore, the substrate 32 may be appropriately substituted by a plate-like member, a roller, or the like.

Although not shown, a detecting element which detects the positions of the pickup unit 21 and the semiconductor integrated circuits 24 is provided as a control unit. In addition, a detecting element which detects the positions of the semiconductor integrated circuits 24 over the first flexible substrate 23 and the bonding unit 22 is provided. Further, a driving portion which drives each of the pickup unit 21, the first supply portion, the roller 30, the first recovery portion, the bonding unit, the second supply portion, the roller 31, the second recovery portion, and the like is provided. Moreover, a driver circuit which drives the driving portion is provided.

As the detecting element, a CCD camera or the like can be used, and image information detected by the detecting element is processed to detect the positions of the semiconductor integrated circuit, the connection terminal of the antenna, or the alignment mark. As the driving portion, a motor can be used, and the driving portion is driven by a signal transmitted from the driver circuit. As the driver circuit, a microcomputer can be used. Specifically, the driver circuit includes a central processing unit, ROM and RAM which are memory portions, and the driver circuit temporarily stores the image information detected by the detecting element, drive information of the driving portion, and the like in the RAM and transmits to the driving portion a signal for driving the driving portion according to the program recorded in the ROM and the information stored in the RAM.

The control unit may be connected to a server, a personal computer, or the like.

The control unit controls the timing of temporarily attaching the semiconductor integrated circuits 24 to the first flexible substrate 23 using the pickup unit 21 and the pressure of the pickup unit 21. In addition, the control unit controls the rotation speed and the rotation operation of each of the first supply portion, the roller 30, and the first recovery portion. Further, the control unit controls the timing of pressing the bonding unit 22 against the second flexible substrate 25 and the semiconductor integrated circuits 24 and the pressure of the bonding unit 22. Furthermore, the control unit controls the rotation speed and the rotation operation of each of the second supply portion, the roller 31, and the second recovery portion.

Note that a flip-chip unit may be provided between the support unit 20 and the pickup unit 21. The flip-chip unit is preferably a pickup unit having a rotating function. A typical example is a roller or a head having a holder. A typical example of the holder is a gripper such as a pair of tweezers or a pawl, a collet, a nozzle capable of adsorption, or the like.

Next, hereinafter described is a method for attaching first components and second components to each other using the above-described attachment apparatus.

Described here is a mode in which surfaces of the first flexible substrate and the second flexible substrate face each other; longer sides thereof, that is, the directions of movement thereof intersect with each other at 90°; the rows and columns of the first components intersect with each other at 90°; and the rows and columns of the second components intersect with each other at 90°.

First components are arranged in a matrix with m rows and n columns, and second components are arranged in a matrix with q rows and p columns. While moving the first flexible substrate, the pickup unit is pressed p times to temporarily attach p rows of the first components to the first flexible substrate. The moving distance of the first flexible substrate at this time is pa. Next, the movement of the first flexible substrate is stopped. After the bonding unit is pressed to connect the first components over the first flexible substrate to the second components over the second flexible substrate, the second flexible substrate is moved by a distance of b. The pressing of the bonding unit and the movement of the second flexible substrate are repeated n times. As a result, the p rows of the first components can be attached to the second components. After this, while moving the first flexible substrate again, the pickup unit is pressed p times and the above-mentioned operation is repeated. Accordingly, the first components arranged in the matrix with m rows and n columns can be attached to the second components arranged in the matrix with q rows and p columns.

Hereinafter described with reference to FIGS. 1A to 1C, 3A to 3C, and 5A to 6E is a manufacturing method of a semiconductor device using a semiconductor integrated circuit as the first component and an antenna as the second component. Note that the i-th row and the j-th column are also referred to as (i, j) in the following description.

Figure 3A:
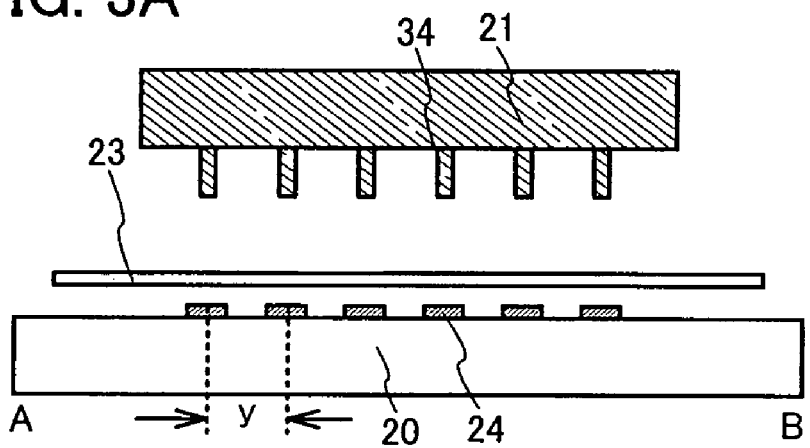
FIGS. 3A to 3C are cross-sectional views illustrating a manufacturing method of a semiconductor device of the present invention.
Figure 3B:
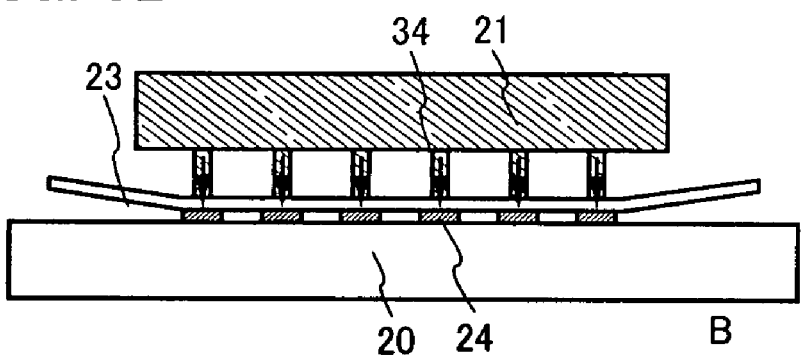
Figure 3C:
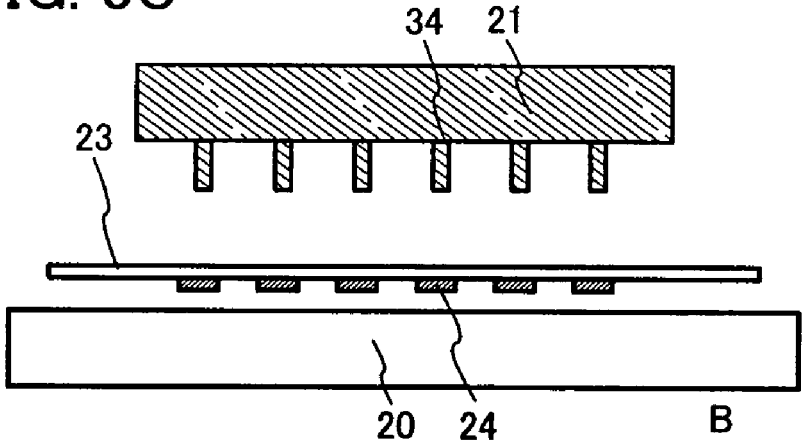

A method for temporarily attaching the semiconductor integrated circuits 24 to the first flexible substrate 23 is described with reference to FIGS. 1A to 1C and 3A to 3C. FIGS. 3A to 3C are cross-sectional views taken along a line A-B in FIG. 1A. FIG. 3A is a diagram similar to FIG. 1B. The semiconductor integrated circuits 24 are arranged over the support unit 20; the first flexible substrate 23 is disposed over the semiconductor integrated circuits 24 at a certain distance; and the pickup unit 21 is disposed over the first flexible substrate 23 at a certain distance.

As shown in FIG. 3B, the pickup unit 21 is pressed against the support unit 20 by the driving portion. Alternatively, the support unit 20 is pressed against the pickup unit. As a result, the semiconductor integrated circuits 24 can be temporarily attached to the first flexible substrate 23 by the pickup unit 21. In this case, by controlling the timing of temporarily attaching the semiconductor integrated circuits 24 to the first flexible substrate 23 by the control device, the row interval of the semiconductor integrated circuits is changed from x to a as shown in FIG. 1A. Note that the interval a is a distance between connection portions of adjacent columns of antennas provided over the second flexible substrate 25. Next, the pickup unit 21 or the support unit 20 is returned to the original position by the driving portion as shown in FIG. 3C. Through the above steps, the semiconductor integrated circuits 24 can be temporarily attached to the first flexible substrate 23.

Described here with reference to FIGS. 5A to 6E is a mode of a different method for temporarily attaching the semiconductor integrated circuits 24 arranged over the support unit 20 to the first flexible substrate 23 on a side provided with connection terminals thereof.

Figure 5A:
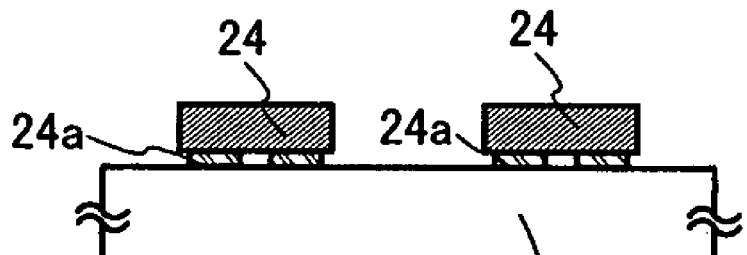
FIGS. 5A to 5C are cross-sectional views illustrating a manufacturing method of a semiconductor device of the present invention.
Figure 5B:
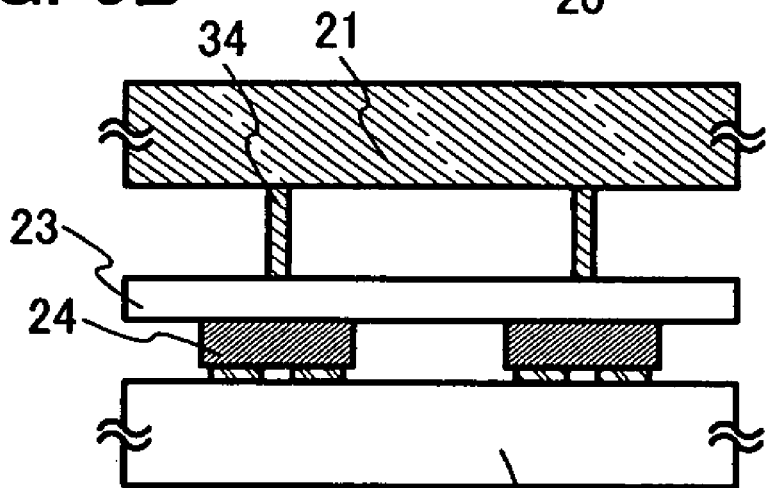
Figure 5C:
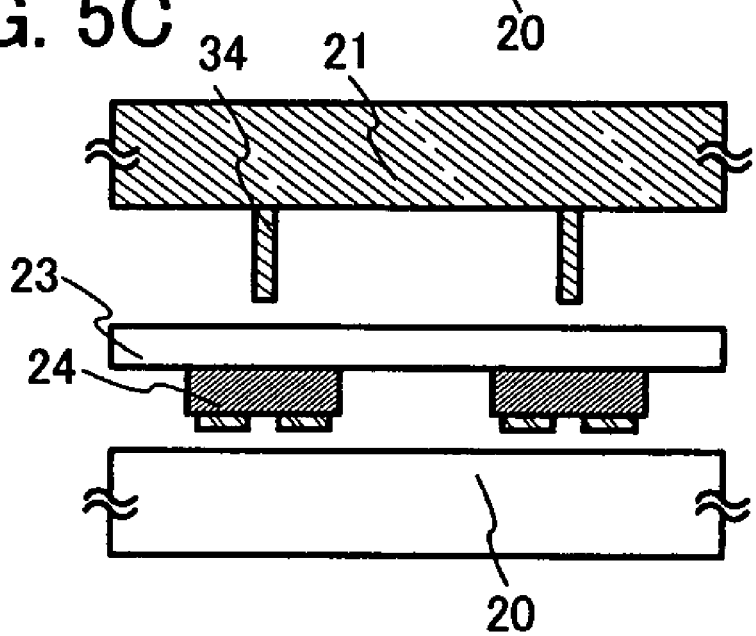

FIGS. 5A to 5C are partial cross-sectional views taken along the line A-B of FIG. 1A, which show a process of temporarily attaching the semiconductor integrated circuits 23 to the first flexible substrate 23.

FIGS. 5A to 5C show a mode in which a connection terminal 24a of the semiconductor integrated circuit 24 faces the support unit 20, and a connecting face of the connection terminal 24a is not exposed on the pickup unit 21 side. Note that as such a structure in which the connection terminal 24a of the semiconductor integrated circuit 24 faces the support unit 20, a through hole may be formed in the semiconductor integrated circuit 24 to expose a semiconductor element, and a plug filling the through hole may be formed as the connection terminal 24a. Alternatively, after the connection terminal 24a is formed over a surface of the semiconductor integrated circuit 24, the semiconductor integrated circuit may be turned upside down and provided over the support unit 20 so that the connection terminal 24a faces the support unit 20.

In this case, the semiconductor integrated circuit 24 and the antenna 26 can be connected to each other by the manufacturing apparatus of a semiconductor device shown in FIGS. 1A to 1C. Specifically, the pickup unit 21 is pressed against the support unit 20 by the driving portion as shown in FIG. 5B. Alternatively, the support unit 20 is pressed against the pickup unit. Next, the pickup unit 21 or the support unit 20 is returned to the original position by the driving portion as shown in FIG. 5C. Through the above steps, the semiconductor integrated circuit 24 can be temporarily attached to the first flexible substrate 23 so that the connection terminal thereof is exposed.

Described next with reference to FIG. 6A to 6E is a mode in which the connection terminal 24a of the semiconductor integrated circuit 24 does not face the support unit 20, and the connecting face of the connection terminal is exposed on the pickup unit 21 side. FIGS. 6A to 6D are partial cross-sectional views taken along the line A-B of FIG. 1A, which show a process of temporarily attaching the semiconductor integrated circuit 24 to the first flexible substrate 23.

In this case, if the semiconductor integrated circuit 24 is temporarily attached to the first flexible substrate 23 by such a method as shown in FIGS. 5A to 5C, the connecting face of the connection terminal 24a faces the first flexible substrate 23, and the connection terminal 24a cannot be connected to the antenna later. Therefore, the manufacturing apparatus of a semiconductor device is provided with a flip-chip unit which turns the semiconductor integrated circuit 24 upside down while the semiconductor integrated circuit 24 is moved from the support unit 20 to the pickup unit 21.

The flip-chip unit may include a holder capable of holding the semiconductor integrated circuit over a surface of a roller. Alternatively, the flip-chip unit may be a pickup unit capable of rotating 180°.

Figure 6A:
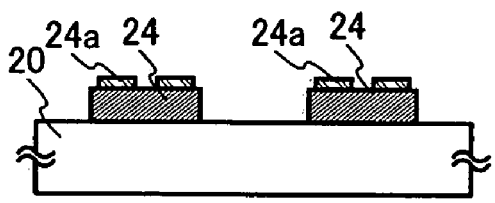
FIGS. 6A to 6E are cross-sectional views illustrating a manufacturing method of a semiconductor device of the present invention.
Figure 6D:
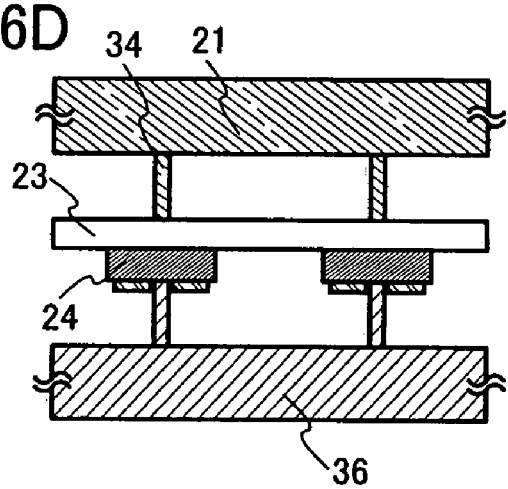
Figure 6B:
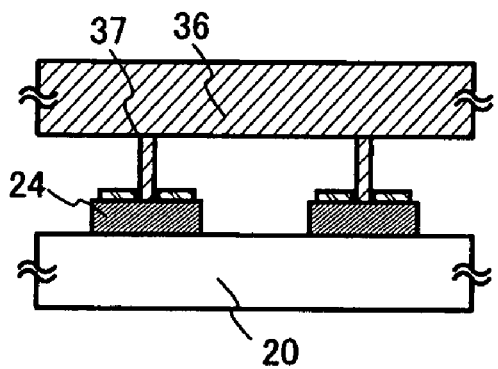

Specifically, a flip-chip unit 36 is pressed against the support unit 20 by the driving portion as shown in FIG. 6B. Alternatively, the support unit 20 is pressed against the flip-chip unit. After this, the flip-chip unit 36 or the support unit 20 is returned to the original position by the driving portion, and the flip-chip unit 36 holds the semiconductor integrated circuit 24. In this case, the flip-chip unit 36 holds the semiconductor integrated circuit 24 by a side provided with the connection terminal 24a of the semiconductor integrated circuit 24.

Figure 6E:
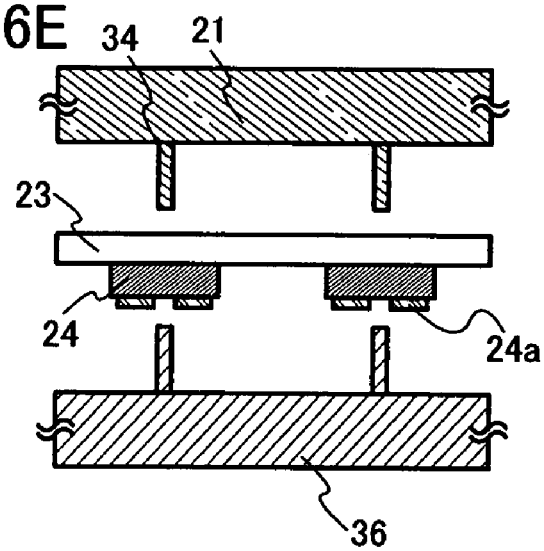
Figure 6C:
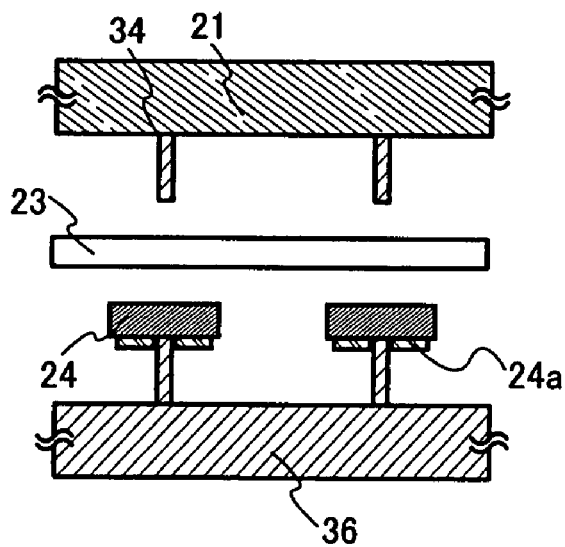

Next, the flip-chip unit 36 is rotated 180° by the driving portion, so that a side of the semiconductor integrated circuit 24 opposite to the side provided with the connection terminal 24a faces the first flexible substrate 23 as shown in FIG. 6C. Further, the first flexible substrate 23 is arranged by the detecting element and the driving portion so that the side of the semiconductor integrated circuit 24 opposite to the side provided with the connection terminal 24a faces the pressing portion 34 of the pickup unit 21 with the first flexible substrate 23 interposed therebetween.

Then, the pickup unit 21 is pressed against the flip-chip unit 36 by the driving portion as shown in FIG. 6D. Alternatively, the flip-chip unit 36 is pressed against the pickup unit 21. After this, the pickup unit 21 or the flip-chip unit 36 is returned to the original position, and the semiconductor integrated circuit 24 is temporarily attached to the first flexible substrate 23 so that the connection terminal 24a is exposed as shown in FIG. 6E.

Through the above process, the semiconductor integrated circuit 24 can be temporarily attached to the first flexible substrate 23.

Described next with reference to FIGS. 1A to 1C, 4A to 4C, and 7A to 11 is a method for connecting the antenna 26 over the second flexible substrate 23 and the semiconductor integrated circuit 24. Note that although the semiconductor integrated circuit is indicated by a solid line in FIGS. 7A to 11, the semiconductor integrated circuit and the antenna practically face each other, and the first flexible substrate 23 and the second flexible substrate 25 are provided on respective outer sides of the semiconductor integrated circuit and the antenna facing each other. In other words, in FIGS. 7A to 11, the first flexible substrate 23 is located in front, and the semiconductor integrated circuit, the antenna, and the second flexible substrate are sequentially located behind.

Figure 4A:
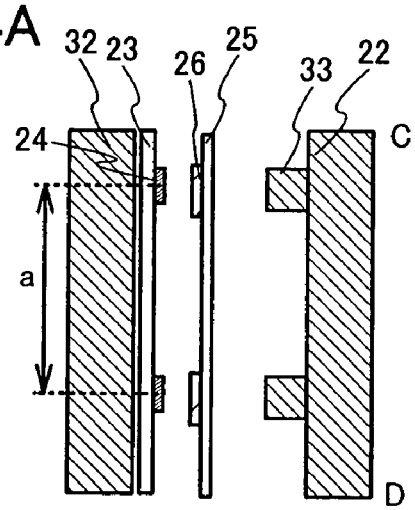
FIGS. 4A to 4C are cross-sectional views illustrating a manufacturing method of a semiconductor device of the present invention.

First, the connection portion 29 of the antenna is aligned with the connection terminal of the semiconductor integrated circuit 24, using the detecting element which detects the positions of the semiconductor integrated circuit 24 and the bonding unit. Specifically, the positions of the first flexible substrate 23 and the second flexible substrate 25 are controlled by the detecting element and the driving portion so that the semiconductor integrated circuit 24 over the first flexible substrate 23 faces the connection portion of the antenna 26 over the second flexible substrate 25 as shown in FIG. 4A.

Figure 4B:
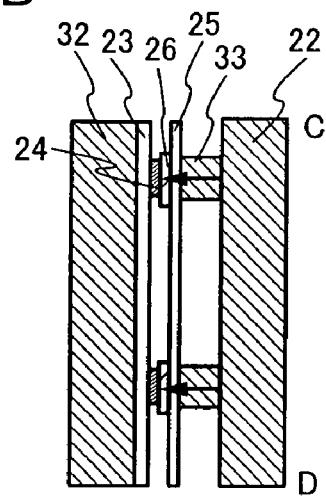
Figure 4C:
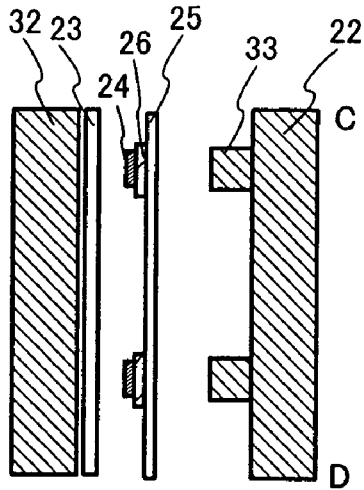
Figure 7A:
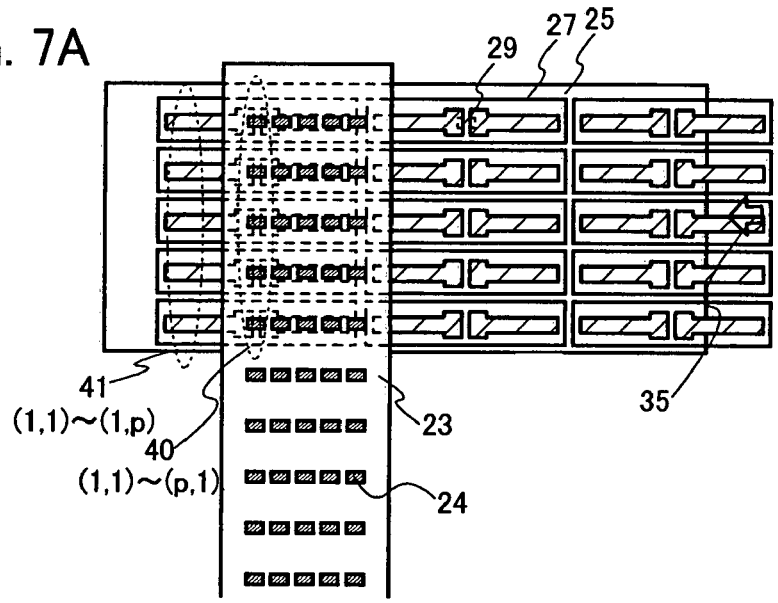
FIGS. 7A and 7B are top views illustrating a manufacturing method of a semiconductor device of the present invention.

Next, the bonding unit 22 is pressed against the substrate 32 by the driving portion as shown in FIG. 4B. Specifically, the semiconductor integrated circuits 40 in the first top-th rows of the first column are connected to respective antennas 41 in the first to pth columns of the first row as shown in FIG. 7A. Then, the bonding unit 22 is returned to the original position by the driving portion as shown in FIG. 3C. Through the above steps, the antenna 26 over the second flexible substrate 25 and the semiconductor integrated circuit 24 can be connected to each other.

Figure 7B:
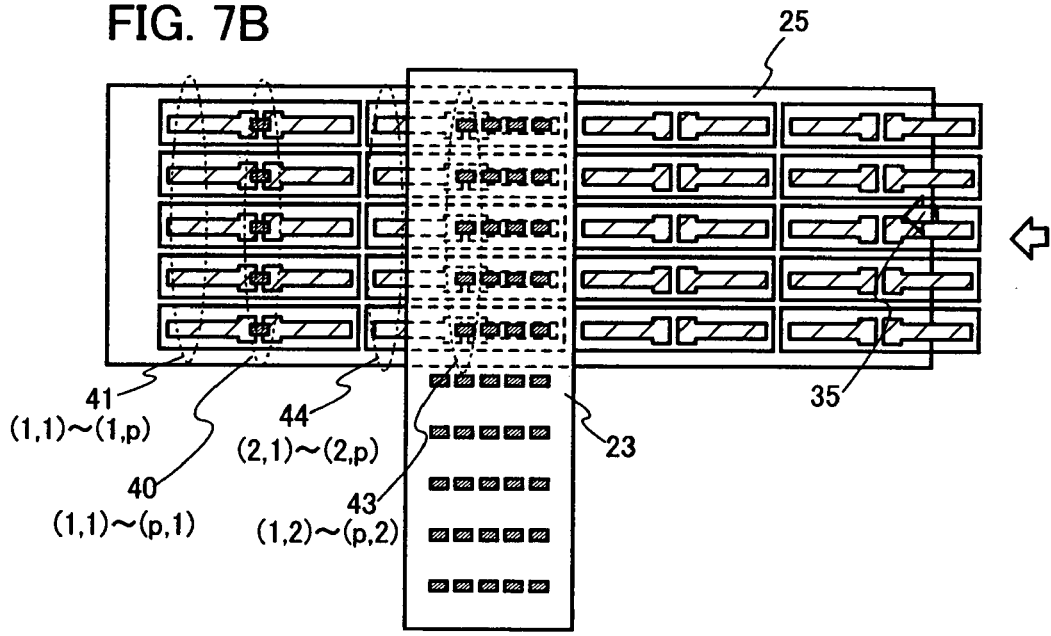

Next, while the first flexible substrate 23 is fixed, the second flexible substrate 25 is moved by b-y in a direction of the arrow 35 by moving the second substrate transport unit by the driving portion as shown in FIG. 7B.

Figure 8:
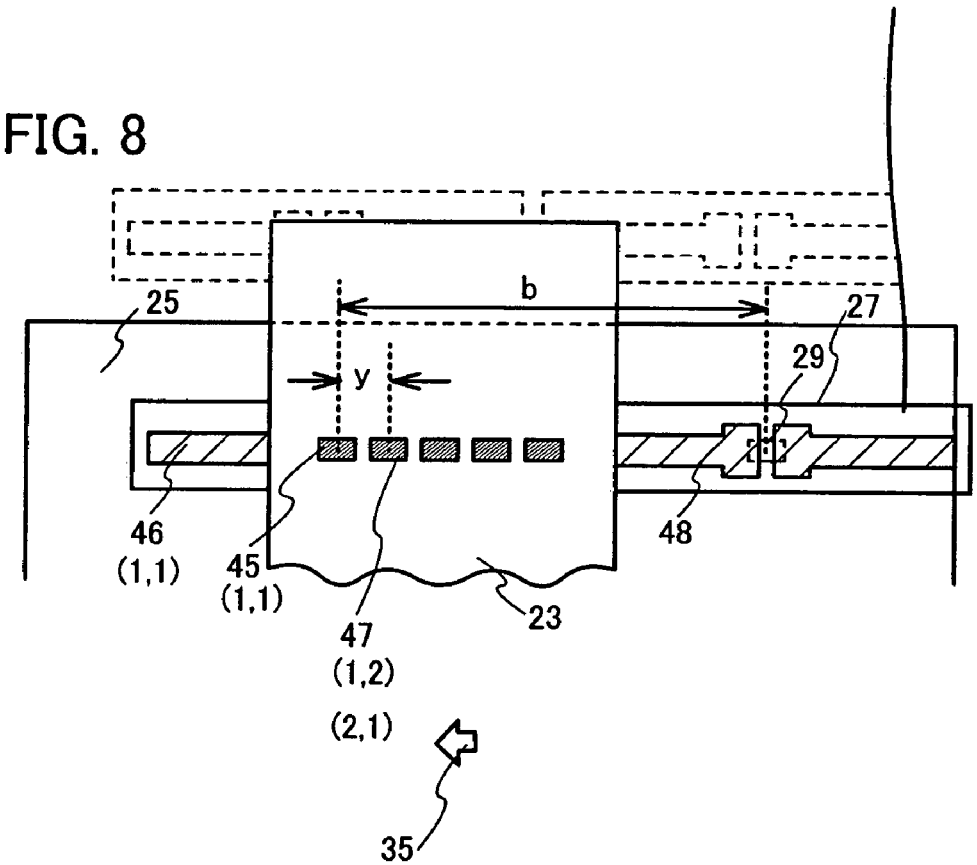
FIG. 8 is a top view illustrating a manufacturing method of a semiconductor device of the present invention.

Here, the moving distance of the second flexible substrate 25 is described with reference to FIG. 8. FIG. 8 shows an enlarged view of FIG. 7A, showing semiconductor integrated circuits in the first to n-th columns of the first row and antennas in the first and second rows of the first column.

A distance between a connection portion of an antenna 46 ((1, 1)) to which a semiconductor integrated circuit 45 ((1, 1)) is connected and a connection portion 29 of an antenna 48 ((2, 1)) in the next row is denoted by b. On the other hand, a distance between the semiconductor integrated circuit 45 ((1, 1)) connected to the antenna 46 and a semiconductor integrated circuit 47 ((1, 2)) in the next column is denoted by y.

In order to connect the semiconductor integrated circuit 47 ((1, 2)) to the antenna 48 ((2, 1)) after the semiconductor integrated circuit 45 ((1, 1)) is connected to the antenna 46 ((1, 1)), the second flexible substrate 25 may be moved in the direction of the arrow 35 by the second substrate transport unit so that the connection portion 29 of the antenna 48 faces the semiconductor integrated circuit 47. In other words, the second flexible substrate 25 may be moved in the direction of the arrow 35 so that the semiconductor integrated circuit 47 over the first flexible substrate 23 is aligned with the connection portion 29 of the antenna 48. Therefore, the moving distance of the second flexible substrate 25 is b-y.

After the second flexible substrate 25 is moved in the direction of the arrow 35 as shown in FIG. 7B, semiconductor integrated circuits 43 in the first to p-th rows of the second column can be connected to respective antennas 44 in the first top-th columns of the second row by pressing the antennas and the semiconductor integrated circuits by the bonding unit 22.

After this, by repeating the connection of the semiconductor integrated circuits and the antennas and the movement of the second flexible substrate, semiconductor integrated circuits of (3, 1) to (3,p) to semiconductor integrated circuits of (n−1, 1) to (n−1, p) can be connected to antennas.

Figure 9A:
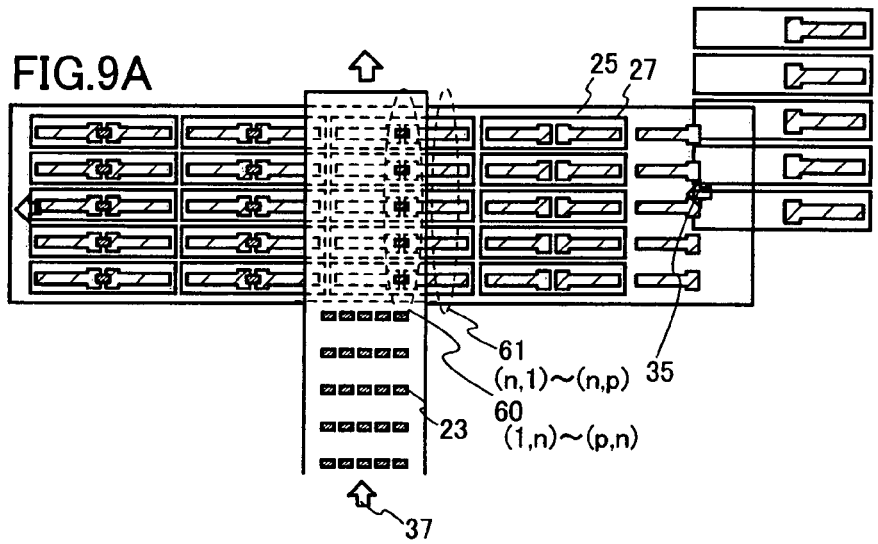
FIGS. 9A and 9B are top views illustrating a manufacturing method of a semiconductor device of the present invention.
Figure 9B:
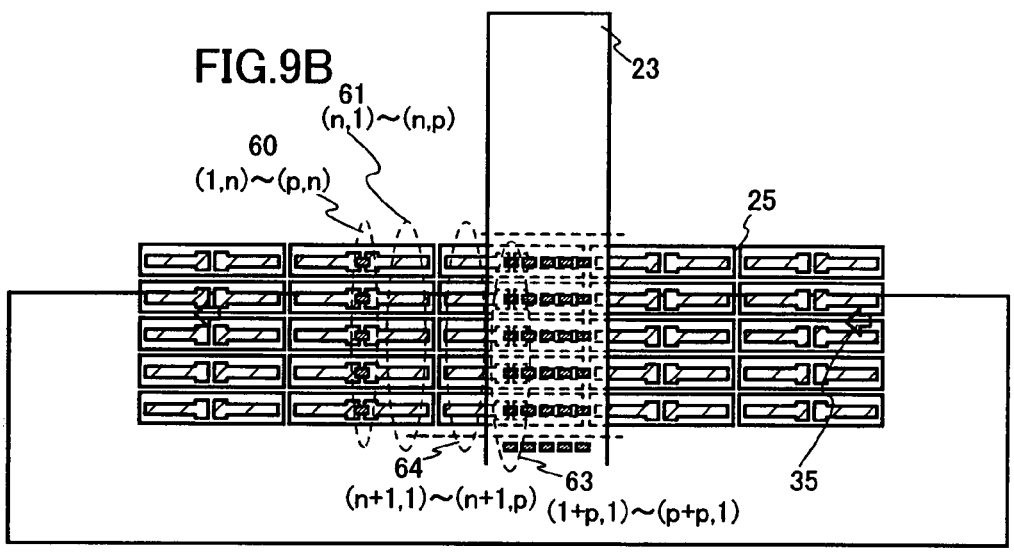

Next, semiconductor integrated circuits 60 in the first to p-th rows of the n-th column are connected to respective antennas 61 in the first to p-th columns of the n-th row as shown in FIG. 9A. As a result, all of the semiconductor integrated circuits in the first top-th rows over the first flexible substrate are temporarily attached to the antennas over the second flexible substrate 25. Thus, the first flexible substrate 23 is moved in the direction of the arrow 37 by pa, and the second flexible substrate 25 is moved in the direction of the arrow 35 by b+(n−1)y. As a result, semiconductor integrated circuits of (1+p, 1) to (p+p, 1) can face antennas of (n+1, 1) to (n+1, p) as shown in FIG. 9B. Thus, semiconductor integrated circuits 63 of (1+p, 1) to (p+p, 1) face connection portions of antennas 64 of (n+1, 1) to (n+1, p). The semiconductor integrated circuits 63 can be connected to the respective antennas 64 by being pressed by the bonding unit.

Figure 10:
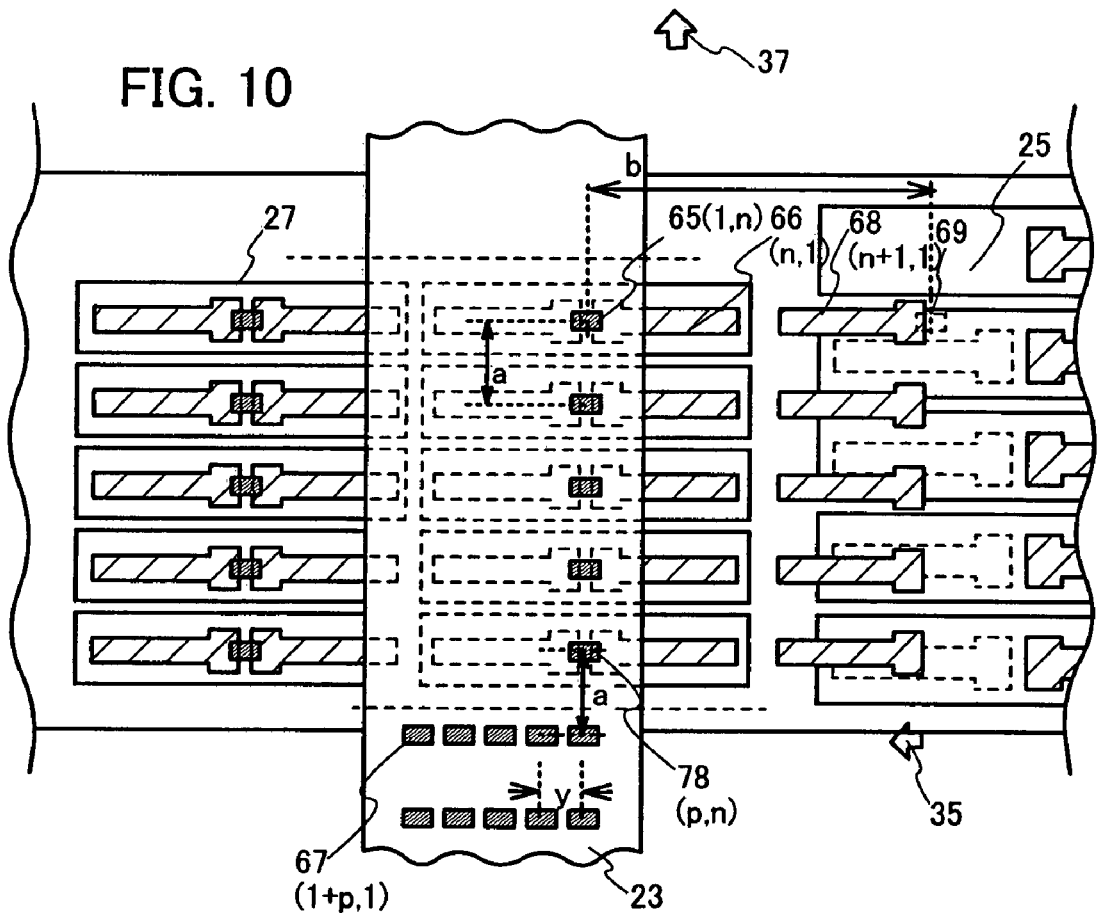
FIG. 10 is a top view illustrating a manufacturing method of a semiconductor device of the present invention.

Described here with reference to FIG. 10 is the moving distances of each of the first flexible substrate 23 and the second flexible substrate 25. Note that the description is given here using an example in which a semiconductor integrated circuit 65 in the first row and the n-th column is connected to a connection portion of an antenna 66 in the n-th row and the first column, and then a semiconductor integrated circuit 67 in the (1+p)-th row and the first column is connected to a connection portion of an antenna 68 in the (n+1)-th row and the first column.

First, the moving distance of antennas in the row direction is described with reference to FIG. 10. A distance between the connection portion of the antenna 66 in the n-th row and the first column, which is a part of the antennas 61 connected to the semiconductor integrated circuits in FIG. 9A, and a connection portion 69 of the antenna 68 in the next row (in the (n+1)-th row and the first column) is denoted by b. On the other hand, an interval between the semiconductor integrated circuits in the column direction is denoted byy. In addition, n columns of semiconductor integrated circuits are provided. Therefore, in order to align the semiconductor integrated circuit 67 over the first flexible substrate 23 with the connection portion 69 of the antenna 68, the second flexible substrate 25 may be moved by b+(n−1)y in the direction of the arrow 35.

Next, the moving distance of the semiconductor integrated circuits in the row direction is similarly described with reference to FIG. 10. A distance between the semiconductor integrated circuits in the row direction is denoted by a. In addition, p columns of antennas are provided. Therefore, in order to align the semiconductor integrated circuit 67 over the first flexible substrate 23 with the connection portion 69 of the antenna 68, the second flexible substrate 25 may be moved by pa in the direction of the arrow 37.

Note that if the number of times the first flexible substrate 23 is moved in the direction of the arrow 37 after the semiconductor integrated circuits of the first to p-th rows are connected to the antennas over the second flexible substrate 25 is denoted by u, semiconductor integrated circuits to be attached to antennas next are those of the (1+up)-th to (p+up)-th rows. The antennas to be attached to the semiconductor integrated circuits are those of the (1+un)-th to (n+un)-th rows (u is a natural number).

In addition, a semiconductor integrated circuit 80 in the i-th row and the j-th column is connected to an antenna 81 in the j-th row and the i-th column as shown in FIG. 11. After the second flexible substrate 25 is moved in the direction of the arrow 35, a semiconductor integrated circuit 82 in the i-th row and the (j+1)-th column can be connected to an antenna 83 in the (j+1)-th row and the i-th column.

Further, a third flexible substrate may be attached to a surface of the second flexible substrate so as to seal the semiconductor integrated circuits and the antennas. Accordingly, the semiconductor integrated circuits and the antennas can be sealed.

After this, the second flexible substrate, and further the third flexible substrate are cut at an appropriate position (for example, along a solid line 27 in FIG. 11). Accordingly, semiconductor devices each including the semiconductor integrated circuit, the antenna, the cut second flexible substrate, and further the cut third flexible substrate can be manufactured.

With the manufacturing apparatus of a semiconductor device of the present invention, and the manufacturing method using the manufacturing apparatus of a semiconductor device of the present invention, antennas of one row among a plurality of antennas can be simultaneously or sequentially connected to a plurality of semiconductor integrated circuits corresponding to the row among a plurality of semiconductor integrated circuits temporarily attached to the first flexible substrate. Therefore, a plurality of semiconductor devices can be manufactured by single bonding treatment. Thus, mass productivity of semiconductor devices can be increased.

Embodiment Mode 2

This embodiment mode describes a mode in which rows and columns of each of first components and second components are arranged to intersect with each other at a certain angle $\theta$.

In an attachment apparatus to be described in this embodiment mode, surfaces of a first substrate and a second substrate face each other, and longer sides thereof, that is, the directions of movement thereof intersect with each other at 90° as shown in FIGS. 1A to 1C. As for first components arranged in a matrix with m rows and n columns, the rows and the columns intersect with each other at arc tan(y/x). In addition, as for second components arranged in a matrix with q rows and p columns, the rows and the columns intersect with each other at arc tan(y/a). Note that without limitation to the above structure, the rows and the columns of the first components arranged in the matrix with m rows and n columns may intersect with each other at 90°; the rows and the columns of the second components arranged in the matrix with q rows and p columns may intersect with each other at 90°; surfaces of the first flexible substrate and the second flexible substrate may face each other; longer sides, that is, the directions of movement of the first flexible substrate and the second flexible substrate may intersect with each other at arc tan(y/a), similarly to Embodiment Mode 1.

Hereinafter described is a mode of a manufacturing apparatus of a semiconductor device using a semiconductor integrated circuit as the first component and an antenna as the second component. Note that instead of the semiconductor integrated circuit, an antenna, a second semiconductor integrated circuit, a sensor, a battery, a wiring board, a display device, a MEMS, or the like can be used appropriately as the first component. Instead of the antenna, a semiconductor integrated circuit, a sensor, a battery, a wiring board, a display device, a MEMS, or the like can be used appropriately as the second component.

Figure 12A:
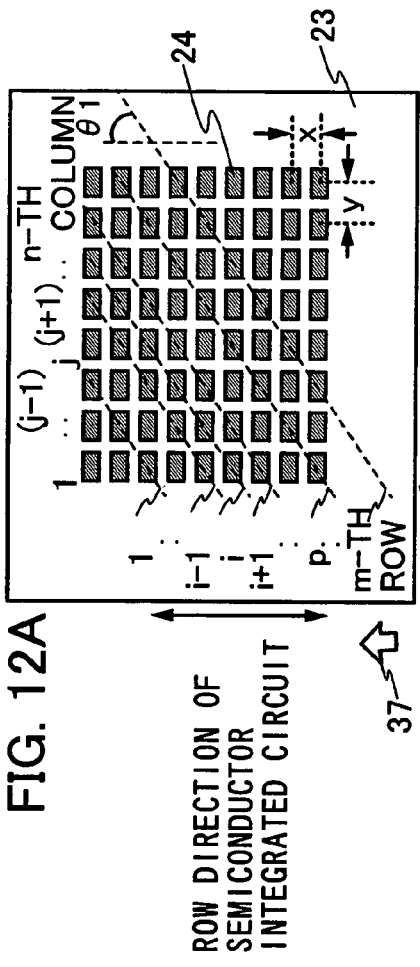
FIGS. 12A and 12B are top views illustrating a semiconductor integrated circuit and an antenna which can be used in the present invention, respectively.

In the manufacturing apparatus of a semiconductor device to be described in this embodiment mode, semiconductor integrated circuits are arranged in a matrix with m rows and n columns over the support unit 20, as one mode of which is shown in FIG. 12A. At this time, a row interval of the semiconductor integrated circuits is x and a column interval thereof is y. Further, a direction parallel to the arrow 37, in which the first flexible substrate 23 moves, is set to the row direction of the semiconductor integrated circuits arranged in a matrix. The rows of the semiconductor integrated circuits of this embodiment mode intersect with the columns of the semiconductor integrated circuits at an angle $\theta1$.

Figure 12B:
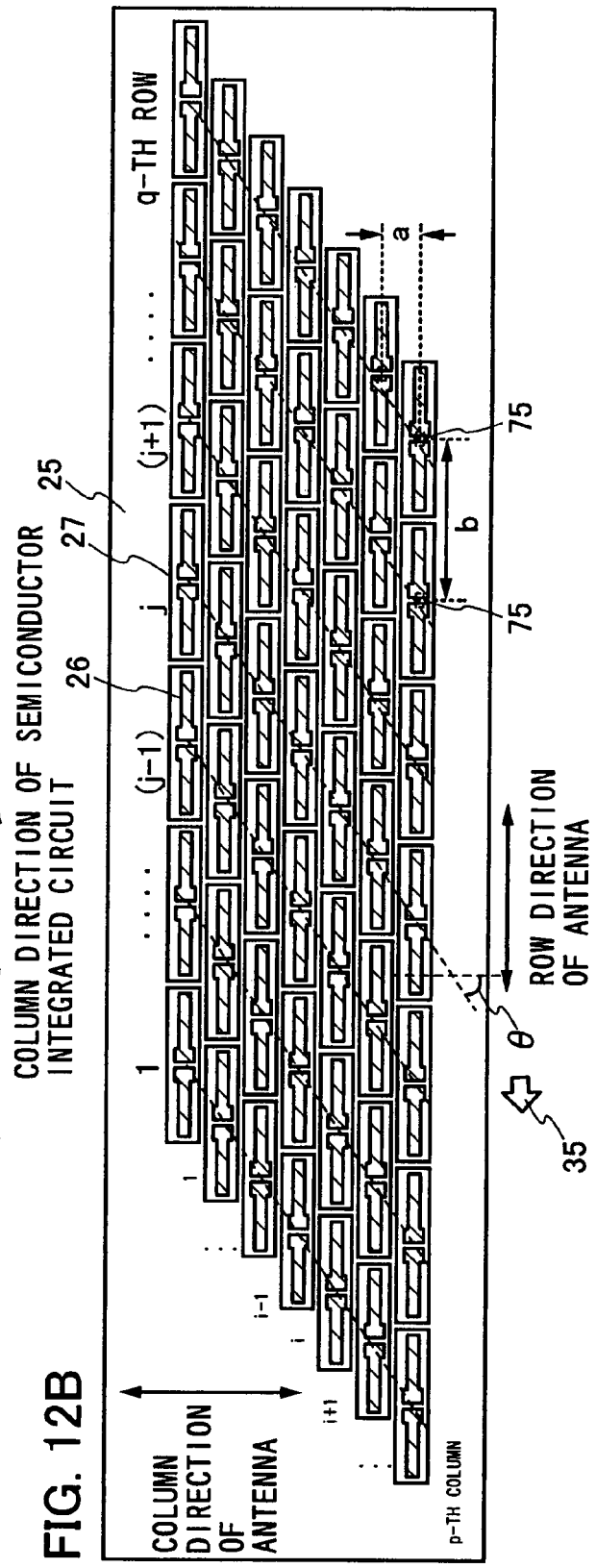

In the manufacturing apparatus of a semiconductor device, the antennas 26 are arranged in a matrix with q rows and p columns over the second flexible substrate 25, as one mode of which is shown in FIG. 12B. At this time, a row interval of connection portions 75 of adjacent antennas is b and a column interval thereof is a. A direction parallel to the arrow 35, in which the second flexible substrate 25 moves, is set to the row direction of the antennas arranged in a matrix. Further, the rows of the antennas intersect with the columns of the antennas at an angle $\theta$.

Note that described here is a mode in which the connection portion 75 of the antenna 26 has a same area to that of the semiconductor integrated circuit 24 similarly to the connection portion 29 of the antenna 26 in Embodiment Mode 1. Alternatively, the area of the connection portion 29 of the antenna 26 may be different from that of the semiconductor integrated circuit 24. In other words, it is acceptable as long as a connection terminal of the semiconductor integrated circuit 24 is electrically connected to the antenna 26 although there is a case where the connection portion 29 of the antenna 26 is not completely overlapped with and is slightly misaligned with the semiconductor integrated circuit 24 depending on the alignment accuracy of the manufacturing apparatus of a semiconductor device.

Next, hereinafter described is a method for attaching the first components and the second components using the above-described attachment apparatus.

Described here is a mode in which surfaces of the first flexible substrate and the second flexible substrate face each other; longer sides thereof, that is, the directions of movement thereof intersect with each other at 90°; the rows and columns of the first components intersect with each other at an angle of $\theta1$=arc tan(y/x); and the rows and columns of the second components intersect with each other at an angle of $\theta$=arc tan(y/a).

The first components are arranged in a matrix with m rows and n columns, and the second components are arranged in a matrix with q rows and p columns. While moving the first flexible substrate, the pickup unit is pressed p times or more to temporarily attach p or more rows of the first components to the first flexible substrate. The moving distance of the first flexible substrate at this time is pa or more. Next, after the first components over the first flexible substrate are moved to a region corresponding to the second components over the second flexible substrate, the bonding unit is pressed to connect the first components over the first flexible substrate to the second components over the second flexible substrate. Then, the second flexible substrate is moved by distance b and the first flexible substrate is moved by distance a. After this, the pressing of the bonding unit, the movement of the first flexible substrate, and the movement of the second flexible substrate are repeated. At this time, if the speed of the first flexible substrate is a and the speed of the second flexible substrate is b, the first components can be sequentially attached to the second components. Note that the first components over the support unit may be temporarily attached to the first flexible substrate by pressing the pickup unit when attaching the first components and the second components to each other by pressing the bonding unit.

Hereinafter described with reference to FIGS. 13A to 14B is a manufacturing method of a semiconductor device using a semiconductor integrated circuit as the first component and an antenna as the second component. Note that although the semiconductor integrated circuit is indicated by a solid line in FIGS. 13A to 14B, the semiconductor integrated circuit and the antenna practically face each other, and the first flexible substrate 23 and the second flexible substrate 25 are provided on respective outer sides of the semiconductor integrated circuit and the antenna facing each other. In other words, in FIGS. 13A to 14B, the first flexible substrate 23 is located in front, and the semiconductor integrated circuit, the antenna, and the second flexible substrate are sequentially located behind.

First, the semiconductor integrated circuits are temporarily attached to the first flexible substrate similarly to Embodiment Mode 1. At this time, the semiconductor integrated circuits are temporarily attached so that a column interval of the semiconductor integrated circuits is changed from x to a.

Figure 13A:
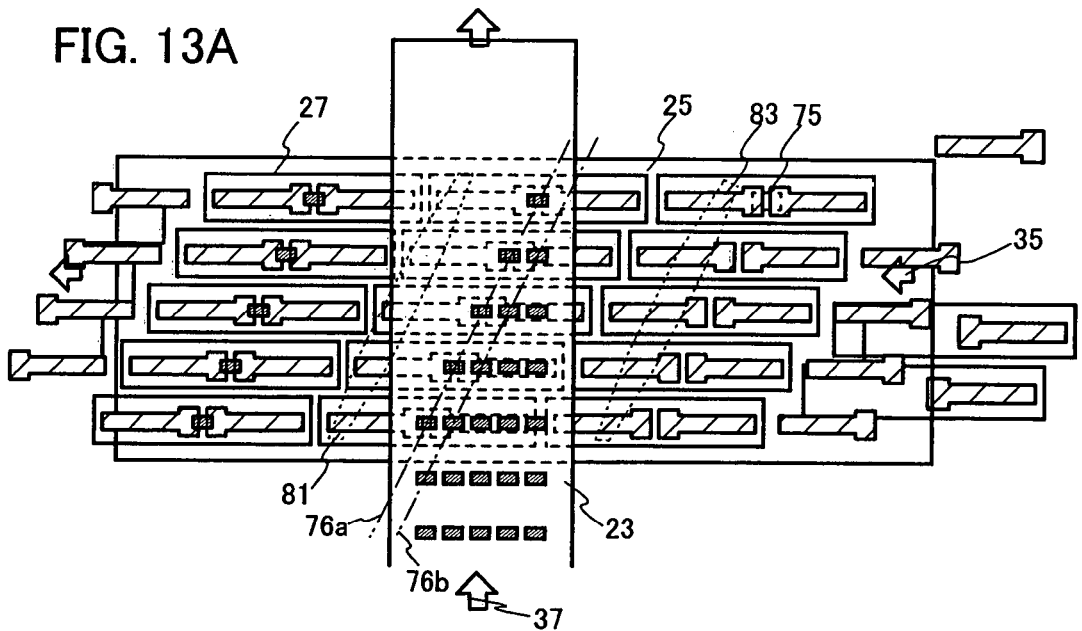
FIGS. 13A and 13B are top views illustrating a manufacturing method of a semiconductor device of the present invention.

As shown in FIG. 13A, in a region where the first flexible substrate 23 overlaps the second substrate 25, semiconductor integrated circuits of the i-th row on a dotted line 76a are connected to connection portions of antennas 81 of the j-th row which face the semiconductor integrated circuits. Note that all of the semiconductor integrated circuits of the i-th row may be simultaneously connected to the antennas. Alternatively, separately from the timing at which the semiconductor integrated circuit in the i-th row and the j-th column is connected to the antenna, a semiconductor integrated circuit 77 in the i-th row and the (j−1)-th column may be connected to a connection portion of an antenna in the i-th row and the (j+1)-th column.

Figure 13B:
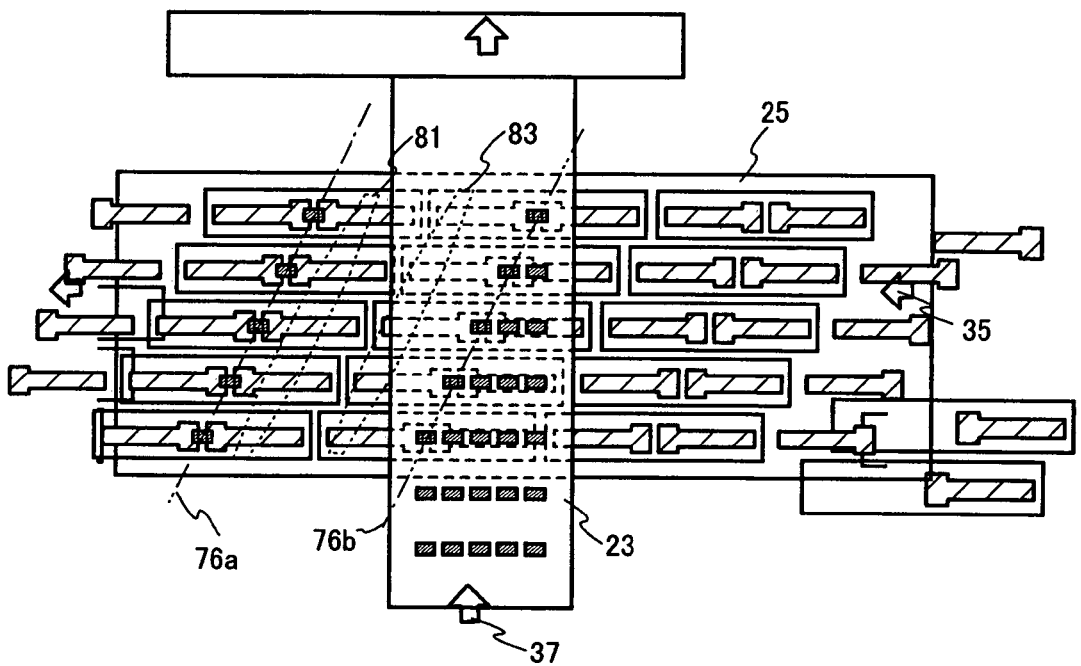

Then, the first flexible substrate 23 is moved in the direction of the arrow 37, and the second flexible substrate 25 is moved in the direction of the arrow 35. As a result, semiconductor integrated circuits of the (i+1)-th row on a dotted line 76b can be arranged to face connection portions of antennas 83 of the (j+1)-th row as shown in FIG. 13B.

Figure 14A:
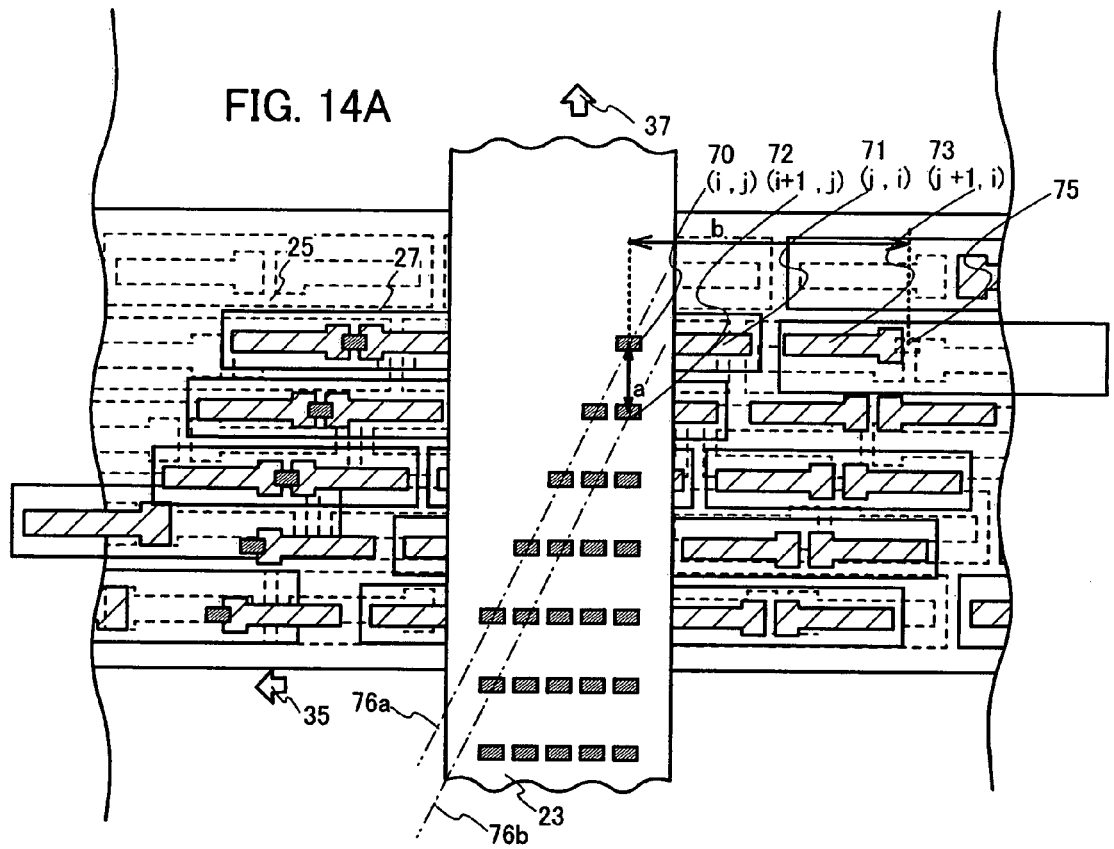
FIGS. 14A and 14B are top views illustrating a manufacturing method of a semiconductor device of the present invention.

The moving distances of the first flexible substrate 23 and the second flexible substrate 25 and the angle θ at which rows and columns of antennas intersect with each other are described with reference to FIG. 14A. Here, the description is given using an example of connecting a semiconductor integrated circuit 70 in the i-th row and the j-th column and an antenna 71 in the j-th row and the i-th column and then connecting a semiconductor integrated circuit 72 in the (i+1)-th row and the j-th column and an antenna in the (j+1)-th row and the i-th column.

After connecting the semiconductor integrated circuit 70 in the i-th row and the j-th column and the antenna 71 in the j-th row and the i-th column, each of the first flexible substrate 23 and the second flexible substrate 25 are moved, so that the semiconductor integrated circuit 72 in the (i+1)-th row and the j-th column and the antenna 73 in the (j+1)-th row and the i-th column face each other.

This requires the movement of the semiconductor integrated circuit 72 to a region where the semiconductor integrated circuit 70 is connected to the antenna 71. Since a distance between the semiconductor integrated circuits 70 and 72 is a, the first flexible substrate 23 is moved by a in the direction of the arrow 37.

On the other hand, the connection portion 75 of the antenna 73 is moved to the region where a connection portion of the antenna 71 is connected to the semiconductor integrated circuit 70. Since a distance between the connection portions of the antennas 71 and 73 is b, the second flexible substrate 25 is moved by b in the direction of the arrow 35.

As a result, the semiconductor integrated circuit 72 in the (i+1)-th row and the j-th column and the antenna 73 in the (j+1)-th row and the i-th column can be arranged to face each other.

Note that if the speed of movement of the first flexible substrate 23 is a and the speed of movement of the second flexible substrate is b, the antennas and the semiconductor integrated circuits can be sequentially connected to each other.

Figure 14B:
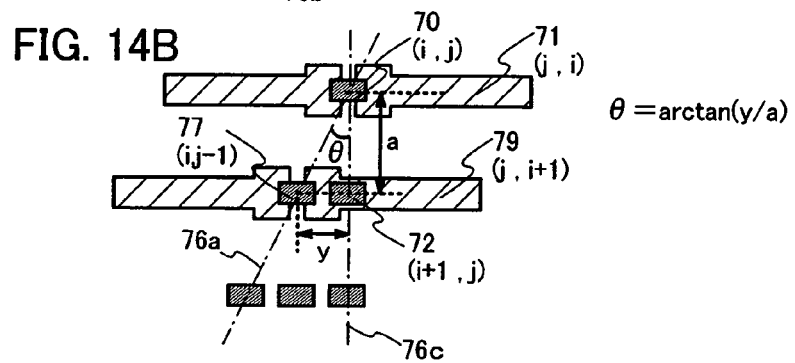

Next, described with reference to FIG. 14B is an angle θ made by the rows and the columns of the semiconductor integrated circuits temporarily attached to the first flexible substrate 23, that is, the angle θ made by the rows and the column direction of the antennas. The row of the semiconductor integrated circuits temporarily attached to the first flexible substrate 23 is arranged on a dotted line 76a, and the column is arranged on a dotted line 76c. In addition, the row and the column of the semiconductor integrated circuits make the angle θ.

A distance in the column direction shown in FIG. 12A between the semiconductor integrated circuits 70 and 72 adjacent to each other in the same column is denoted by a. A distance in the row direction shown in FIG. 12A between the semiconductor integrated circuits 72 and 77 adjacent to each other in the same row is denoted by y. From these two distances, the angle θ is arc tan(y/a).

Then, as shown in FIG. 13B, the semiconductor integrated circuits of the (i+1)-th row and the antennas of the (j+1)-th row which face each other are attached with pressure by the bonding unit to connect the semiconductor integrated circuits and the antennas.

Further, a third flexible substrate may be attached to the surface of the second flexible substrate so as to seal the semiconductor integrated circuits and the antennas. As a result, the semiconductor integrated circuits and the antennas can be sealed.

After this, the second flexible substrate, and further the third flexible substrate are cut at an appropriate position (for example, along a solid line 27). Accordingly, semiconductor devices each including the semiconductor integrated circuit, the antenna, the cut second flexible substrate, and further the cut third flexible substrate can be manufactured.

With the manufacturing apparatus of a semiconductor device of the present invention, and the manufacturing method using the manufacturing apparatus of a semiconductor device of the present invention, antennas of one row among a plurality of antennas can be simultaneously or sequentially connected to semiconductor integrated circuits corresponding to the row among a plurality of semiconductor integrated circuits temporarily attached to the first flexible substrate. Therefore, a plurality of semiconductor devices can be manufactured by single bonding treatment. In addition, the first flexible substrate and the second flexible substrate can be fed in synchronization with each other. Thus, mass productivity of semiconductor devices can be increased.

Embodiment 1

This embodiment describes a manufacturing process of a semiconductor device capable of contactless data transmission with reference to FIGS. 15A to 17B.

Figure 15A:
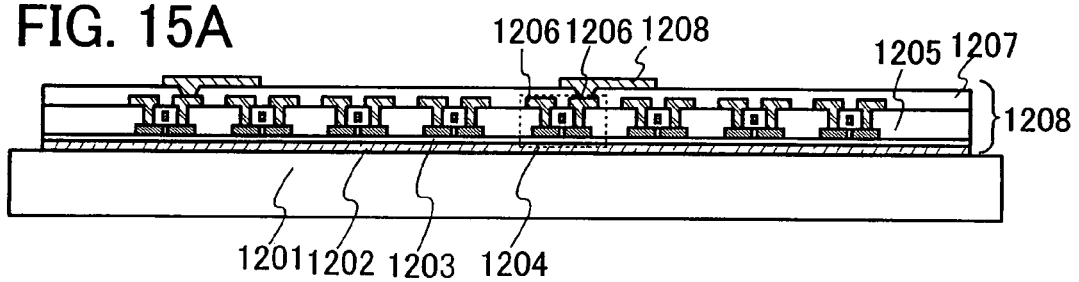
FIGS. 15A to 15E are cross-sectional views illustrating a manufacturing process of a semiconductor device of the present invention.

As shown in FIG. 15A, a peeling layer 1202 is formed over a substrate 1201; an insulating layer 1203 is formed over the peeling layer 1202; a thin film transistor 1204 and an interlayer insulating layer 1205 for insulating a conductive layer of the thin film transistor are formed over the insulating layer 1203; and source and drain electrodes 1206 connected to a semiconductor layer of the thin film transistor are formed. Next, an insulating layer 1207 which covers the thin film transistor 1204, the interlayer insulating layer 1205, and the source and drain electrodes 1206 is formed, and a conductive layer 1208 connected to the source or drain electrode 1206 with the insulating layer 1207 interposed therebetween is formed.

As the substrate 1201, a glass substrate, a quartz substrate, a metal substrate or a stainless-steel substrate having an insulating layer formed on its surface, a heat-resistant plastic substrate which can withstand the treatment temperature of the process in this embodiment, or the like is used. There is no limitation on the size or shape of the above-mentioned substrate 1201. Therefore, if the above substrate having a rectangular shape with a side of one meter or longer is used as the substrate 1201, productivity can be improved significantly. This is a great advantage over a circular silicon substrate.

The peeling layer 1202 is formed using a single layer or stacked layers formed by a sputtering method, a plasma CVD method, a coating method, a printing method, or the like with an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si), or an alloy material or a compound material containing such an element as a main component. A crystal structure of a layer containing silicon may be any of an amorphous structure, a microcrystalline structure, or a polycrystalline structure.

When the peeling layer 1202 has a single-layer structure, it is preferable to form a tungsten layer, a molybdenum layer, or a layer containing a mixture of tungsten and molybdenum. Alternatively, the peeling layer 1202 is formed using a tungsten oxide layer, a tungsten oxynitride layer, a molybdenum oxide layer, a molybdenum oxynitride layer, or a layer containing oxide or oxynitride of a mixture of tungsten and molybdenum. Note that the mixture of tungsten and molybdenum corresponds to, for example, an alloy of tungsten and molybdenum.

When the peeling layer 1202 has a stacked-layer structure, it is preferable to form, as a first layer, a tungsten layer, a molybdenum layer, or a layer containing a mixture of tungsten and molybdenum, and form, as a second layer, a oxide, nitride, oxynitride, or nitride oxide layer of tungsten, molybdenum, or a mixture of tungsten and molybdenum.

When the peeing layer 1202 is formed to have a stacked-layer structure of a tungsten layer and a tungsten oxide layer, the fact may be utilized that, by formation of a tungsten layer and an insulating oxide layer over the tungsten layer, a tungsten oxide layer is formed at an interface between the tungsten layer and the insulating layer. Furthermore, a tungsten oxide layer may be formed by performing thermal oxidation treatment, oxygen plasma treatment, N$_2$O plasma treatment, treatment with a solution having strong oxidation power such as ozone water or water containing hydrogen, or the like to the surface of the tungsten layer. The same applies to a case of forming a tungsten nitride layer, a tungsten oxynitride layer, or a tungsten nitride oxide layer. It is preferable to form a tungsten layer first, and then form a silicon nitride layer, a silicon oxynitride layer, and a silicon nitride oxide layer over the tungsten layer.

Tungsten oxide is represented by WO$_x$, where x is in the range of 2 to 3, inclusive. There are cases where x is 2 (WO$_2$), x is 2.5 (W$_2$O$_5$), x is 2.75 (W$_4$O$_{11}$), x is 3 (WO$_3$), and the like.

Although the peeling layer 1202 is formed so as to be in contact with the substrate 1201 in the above step, the present invention is not limited to this step. A base insulating layer may be formed in contact with the substrate 1201, and the peeling layer 1202 is then formed in contact with the insulating layer.

The insulating layer 1203 is either a single layer or stacked layers of an inorganic compound formed by a sputtering method, a plasma CVD method, a coating method, a printing method, or the like. As a typical example of the inorganic compound, silicon oxide or silicon nitride can be given.

Further, the insulating layer 1203 may have a stacked-layer structure. For example, the insulating layer 1203 may be formed by stacking layers of inorganic compounds, and typically by stacking layers of silicon oxide, silicon nitride oxide, and silicon oxynitride.

The thin film transistor 1204 includes a semiconductor layer having a source region, a drain region, and a channel formation region; a gate insulating layer; and a gate electrode.

The semiconductor layer is a layer formed of a semiconductor with a crystalline structure, and either a non-single crystalline semiconductor or a single crystalline semiconductor can be used. In particular, it is preferable to use a crystalline semiconductor which is crystallized by heat treatment or a crystalline semiconductor which is crystallized by a combination of heat treatment and laser light irradiation. For the heat treatment, a crystallization method can be employed, which uses a metal element such as nickel having a function to promote the crystallization of a silicon semiconductor. Further, through the heating in the crystallization step of the silicon semiconductor, the surface of the peeling layer 1202 can be oxidized to form a metal oxide layer at an interface between the peeling layer 1202 and the insulating layer 1203.

In the case of performing crystallization by laser light irradiation in addition to heat treatment, crystallization can be performed by continuously moving a melted zone of the crystalline semiconductor, which is melted by irradiation with a continuous wave laser beam or a high-repetition-rate ultrashort pulsed laser beam having a repetition rate of 10 MHz or higher and a pulse width of 1 nanosecond or shorter, preferably in the range of 1 to 100 picoseconds inclusive, along the laser beam irradiation direction. By such a crystallization method, a crystalline semiconductor having crystal grains which have a large grain size and have a grain boundary grown in one direction can be obtained. By aligning the drift direction of carriers with the direction in which such a crystal grain boundary is grown, field-effect mobility of the transistor can be increased. For example, 400 cm²/V-sec or higher can be attained.

In a case of employing a crystallization process at a temperature equal to or lower than the allowable temperature limit of a glass substrate (approximately 600° C.) as the above crystallization step, a large-area glass substrate can be used. Therefore, large quantities of semiconductor devices can be manufactured from one substrate, and thus cost reduction can be achieved.

Alternatively, a semiconductor layer can be formed by performing a crystallization step by heating at a temperature equal to or higher than the allowable temperature limit of a glass substrate. Typically, a quartz substrate is used as the substrate 1201 having an insulating surface, and an amorphous or microcrystalline semiconductor is heated at 700° C. or higher, thereby forming a semiconductor layer. As a result, a semiconductor with high crystallinity can be formed. Therefore, it is possible to provide a thin film transistor which has excellent characteristics such as a high response speed and high mobility and which can operate at high speed.

The gate insulating layer is formed using an inorganic insulator such as silicon oxide or silicon oxynitride.

The gate electrode can be formed using a metal, or a polycrystalline semiconductor to which an impurity having one conductivity type is added. In the case of using a metal, tungsten (W), molybdenum (Mo), titanium (Ti), tantalum (Ta), aluminum (Al), or the like can be used. A metal nitride which is obtained by nitriding a metal can also be used. Alternatively, the gate electrode may have a stacked-layer structure of a first layer made of the metal nitride and a second layer made of the metal. In the case of employing a stacked-layer structure, the gate electrode may have a shape in which the edge of the first layer extends beyond the edge of the second layer. In that case, if the first layer is formed of a metal nitride, it can function as a barrier metal. In other words, the metal of the second layer can be prevented from diffusing into the gate insulating layer or the semiconductor layer below the gate insulating layer.

The thin film transistor which is formed by combining the semiconductor layer, the gate insulating layer, the gate electrode, and the like can have various structures such as a single drain structure, an LDD (Lightly Doped Drain) structure, and a gate overlapped drain structure. Here, a thin film transistor with a single drain structure is described. Alternatively, the thin film transistor can have a multigate structure where transistors to which an equal gate potential is applied are connected in series, a dual gate structure where a semiconductor layer is interposed between gate electrodes, an inverted staggered structure where a gate electrode is formed over the insulating layer 1203, and a gate insulating layer and a semiconductor layer are formed over the gate electrode, or the like.

The source and drain electrodes 1206 are preferably formed using a combination of a low-resistance material such as aluminum (Al) and a barrier metal using a high-melting-point metal material such as titanium (Ti) or molybdenum (Mo), e.g., a stacked-layer structure of titanium (Ti) and aluminum (Al) or a stacked-layer structure of molybdenum (Mo) and aluminum (Al).

The interlayer insulating layer 1205 and the insulating layer 1207 are formed using polyimide, acrylic, or a siloxane polymer.

Further, instead of the thin film transistor 1204, a semiconductor element having any structure may be provided as long as it can function as a switching element. A typical example of the switching element is a MIM (Metal-Insulator-Metal), a diode, or the like.

Figure 15B:
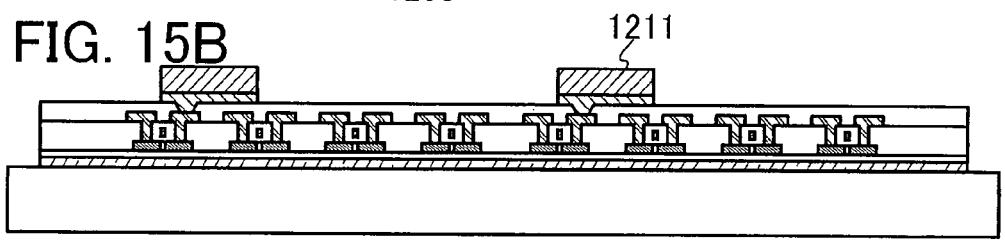

Next, as shown in FIG. 15B, a conductive layer 1211 is formed over the conductive layer 1208. Here, the conductive layer 1211 is formed by printing a composition containing metal particles by a printing method, and then heating and baking the composition at 200° C. for 30 minutes.

Figure 15C:
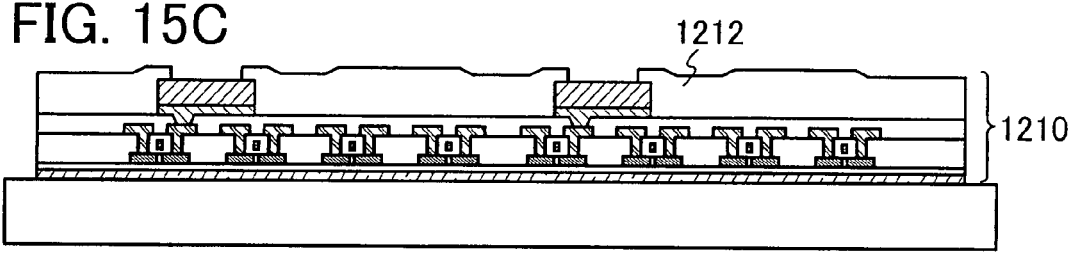

Then, as shown in FIG. 15C, an insulating layer 1212 which covers the insulating layer 1207 and the edge of the conductive layer 1211 is formed. Here, an epoxy resin is applied by a spin coating method and heated at 160° C. for 30 minutes. Then, a portion of the insulating layer 1212 which covers the conductive layer 1211 is removed to expose the conductive layer 1211. Here, a stack having the insulating layer 1203 as the bottom layer and the insulating layer 1212 as the top layer is referred to as an element formation layer 1210.

Figure 15D:
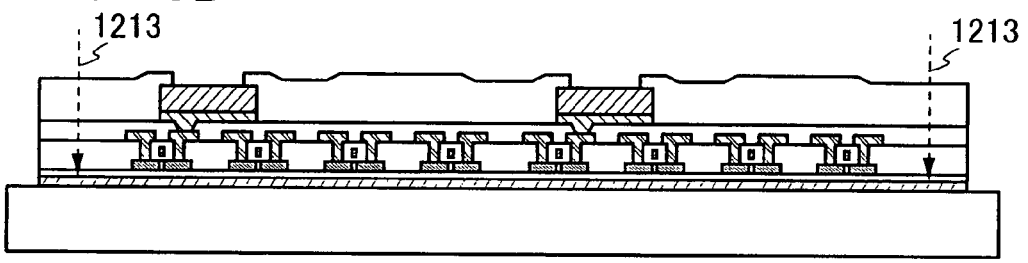
Figure 15E:
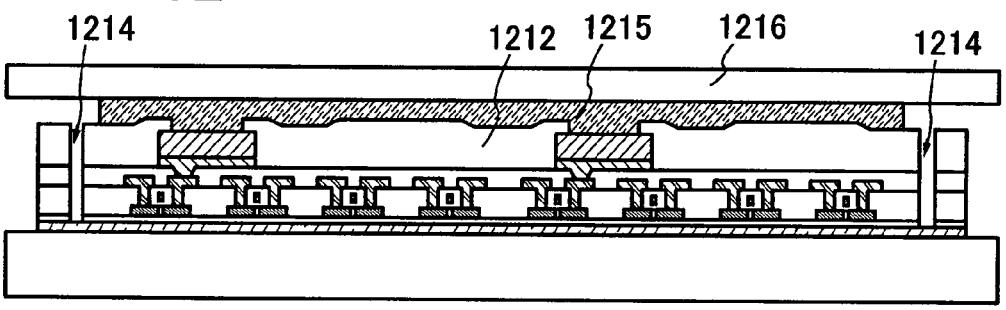

After that, in order to facilitate the later peeling step, the insulating layers 1203, 1205, 1207, and 1212 are irradiated with laser beams 1213 as shown in FIG. 15D to form openings 1214 as shown in FIG. 15E. As the laser beams used for forming the openings 1214, laser beams having a wavelength which can be absorbed by the insulating layers 1203, 1205, 1207, and 1212 are preferably used. Typically, a laser beam in the UV region, visible region, or infrared region is selected as appropriate for irradiation.

As a laser oscillator which can produce such laser beams, the following can be used: an excimer laser such as a KrF, ArF, or XeCl laser; a gas laser such as a He, He—Cd, Ar, He—Ne, HF, or $CO_2$ laser; a solid-state laser such as a crystal laser in which crystals such as YAG, $GdVO_4$, $YVO_4$, YLF, or $YAlO_3$ are doped with Cr, Nd, Er, Ho, Ce, Co, Ti, or Tm, a glass laser, or a ruby laser; or a semiconductor laser such as a GaN, GaAs, GaAlAs, or InGaAsP laser. Note that in the case of using a solid-state laser oscillator, it is preferable to use the fundamental wave to the fifth harmonic as appropriate. As a result, the insulating layers 1203, 1205, 1207, and 1212 absorb the laser beams and melt, and thus openings are formed therein.

Note that when the step of irradiating the insulating layers 1203, 1205, 1207, and 1212 with laser beams is omitted, throughput can be improved.

Next, a support base 1216 is attached to the insulating layer 1212 with an adhesive agent 1215.

The adhesive agent 1215 is a peelable adhesive agent, and a UV peelable adhesive agent which can be peeled off by an ultraviolet ray, a heat peelable adhesive agent which can be peeled off by heat, a water-soluble adhesive agent, a double-sided tape, or the like can be used. Here, a heat peelable adhesive agent is used as the adhesive agent 1215. As a material of the support base 1216, a glass substrate, a quartz substrate, a metal substrate, a plastic substrate, a flexible substrate (e.g., PET, PES, polycarbonate, or paper made of a fibrous material), or the like can be used as appropriate. Here, synthetic paper is used as the support base 1216.

Note that the adhesive strength between the adhesive agent 1215, the support base 1216, and the element formation layer 1210 is set to be higher than the adhesive strength between the peeling layer 1202 and the insulating layer 1203. Then, only the element formation layer 1210 including the insulating layer 1203 is peeled from the substrate 1201.

Figure 16A:
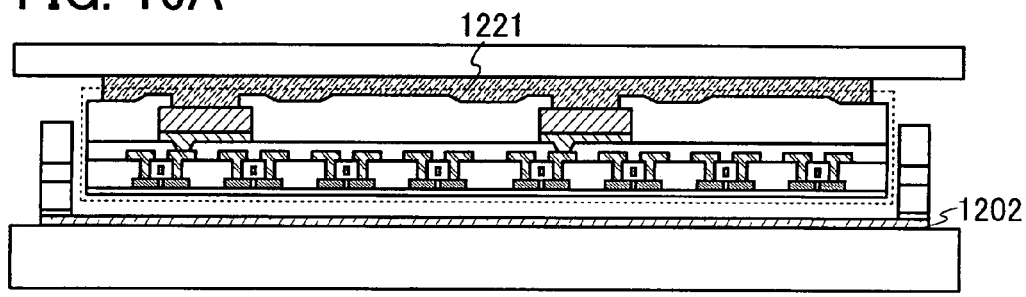
FIGS. 16A to 16D are cross-sectional views illustrating a manufacturing process of a semiconductor device of the present invention.

Next, as shown in FIG. 16A, the substrate 1201 having the peeling layer 1202 and a part 1221 of the element formation layer are separated from each other by a physical method at the metal oxide layer which is formed at the interface between the peeling layer and the insulating layer 1203. The physical method means a dynamical method or a mechanical method, i.e., a method for changing some dynamical (mechanical) energy. Typically, the physical method means an action of applying mechanical force (e.g., a peeling process with a human hand or with a gripper, or a separation process by rotating a roller as a supporting point).

The above peeling step is characterized in that a layer which does not shrink by heat treatment, a layer which shrinks by heat treatment, and an intermediate layer between the two layers are provided, and heat treatment is performed at the completion of the peeling step or during the peeling step, so that excessive stress is applied to the intermediate layer or to a region in the vicinity of the intermediate layer, and after that, by applying a stimulus to the intermediate layer, separation occurs at the intermediate layer or in the region in the vicinity of the intermediate layer.

In this embodiment, the layer which does not shrink by heat treatment is the peeling layer 1202; the layer which shrinks by heat treatment is the insulating layer 1203 or the insulating layer 1212; and the intermediate layer between the two layers is the metal oxide layer formed at the interface between the peeling layer 1202 and the insulating layer 1203. As a typical example, when a tungsten layer is used as the peeling layer 1202, silicon oxide or silicon nitride is used as the insulating layer 1203, and an epoxy resin is used as the insulating layer 1212, the peeling layer 1202 does not shrink by the heat treatment in crystallization, impurity activation, or dehydrogenation of an amorphous silicon film, whereas the insulating layer 1203 and the insulating layer 1212 shrink, and further, a tungsten oxide layer ($WO_x$ where $2 \leq x \leq 3$) is formed at the interface between the peeling layer 1202 and the insulating layer 1203. Since a tungsten oxide layer is weak, it can easily be separated by the above physical method. As a result, the part 1221 of the element formation layer can be separated from the substrate 1201 by the above physical method.

Although this embodiment employs a method in which the metal oxide film is formed between the peeling layer and the insulating layer, and the element formation layer 1210 is separated at the metal oxide film by a physical method, the present invention is not limited to this. For example, a method can be used in which a light-transmitting substrate is used as the substrate, an amorphous silicon layer containing hydrogen is used as the peeling layer, and after the step in FIG. 15E, the amorphous silicon layer is irradiated with a laser beam from a substrate side so that hydrogen contained in the amorphous silicon layer is vaporized and separation occurs between the substrate and the peeling layer.

Alternatively, after the step in FIG. 15E, a method of removing the substrate by mechanical polishing, or a method of removing the substrate by using a solution such as HF which can dissolve the substrate can be employed. In this case, the peeling layer can be omitted.

Further alternatively, the following method can be used: before attaching the support base 1216 to the insulating layer 1212 by using the adhesive agent 1215 in FIG. 15E, a halogen fluoride gas such as $NF_3$, $BrF_3$, or $ClF_3$ is introduced into the openings 1214 so that the peeling layer is removed by etching with the halogen fluoride gas, and the support base 1216 is attached to the insulating layer 1212 by using the adhesive agent 1215, and then the element formation layer 1210 is separated from the substrate.

Still alternatively, the following method can be used: before attaching the support base 1216 to the insulating layer 1212 by using the adhesive agent 1215 in FIG. 15E, a halogen fluoride gas such as $NF_3$, $BrF_3$, or $ClF_3$ is introduced into the openings 1214 so that the peeling layer is partially removed by etching with the halogen fluoride gas, and the support base 1216 is attached to the insulating layer 1212 with the adhesive agent 1215, and then the element formation layer 1210 is separated from the substrate by a physical method.

Figure 16B:
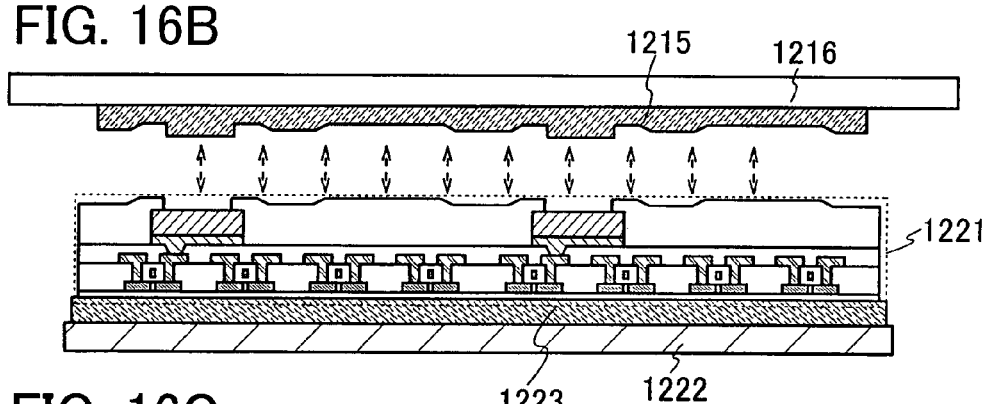

Next, as shown in FIG. 16B, a flexible substrate 1222 is attached to the insulating layer 1203 in the part 1221 of the element formation layer with a second adhesive agent 1223. As the flexible substrate 1222, the substrate 111 described in Embodiment Mode 1 can be used as appropriate.

As a method of attaching the flexible substrate 1222 to the insulating layer 1203, there is a method of attaching the flexible substrate 1222 with an adhesive agent, and a method of attaching the flexible substrate 1222 to the insulating layer 1203 including the steps of heating the flexible substrate 1222 so that the flexible substrate 1222 is partially melted, and cooling the flexible substrate 1222. Note that the adhesive strength between the insulating layer 1203 and the flexible substrate 1222 is set to be higher than the adhesive strength between the adhesive agent 1215, the support base 1216, and the element formation layer 1210. In the case of attaching the flexible substrate 1222 with an adhesive agent, a material having higher adhesiveness than the adhesive agent 1215 is selected as appropriate. Then, the support base 1216 is peeled off from the part 1221 of the element formation layer with the use of the adhesive agent 1215.

Figure 16C:
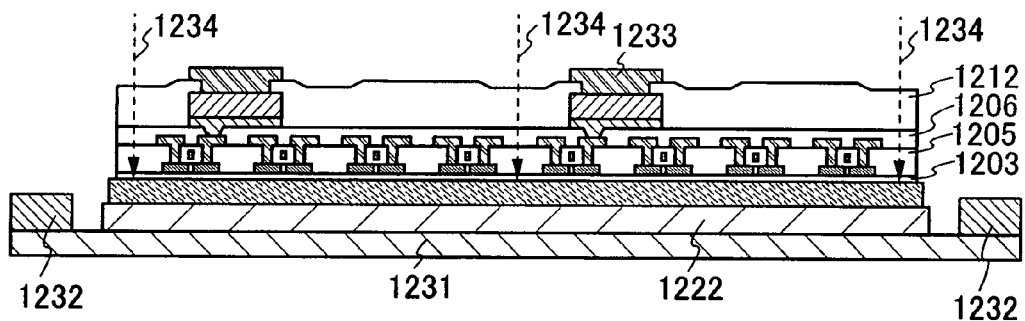

Next, as shown in FIG. 16C, the flexible substrate 1222 is attached to a UV tape 1231 on a dicing frame 1232. Since the UV tape 1231 has adhesiveness, the flexible substrate 1222 is fixed on the UV tape 1231. After that, the conductive layer 1211 may be irradiated with a laser beam to increase the adhesion between the conductive layer 1211 and the conductive layer 1208.

Then, a connection terminal 1233 is formed over the conductive layer 1211. Forming the connection terminal 1233 can facilitate a later process of alignment with and attachment to a conductive layer functioning as an antenna.

Figure 16D:
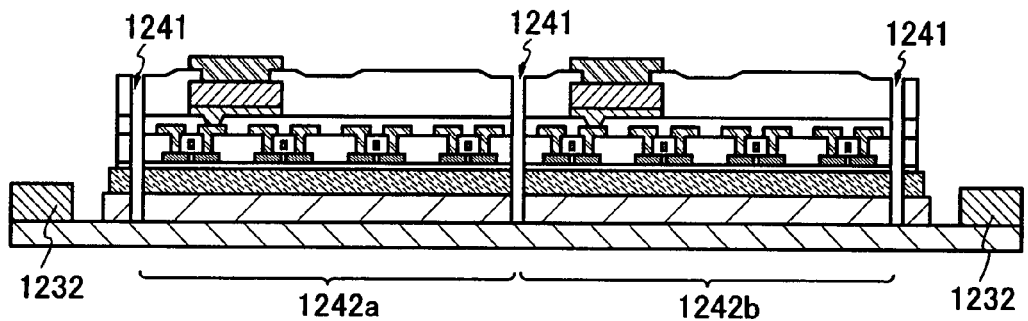

After that, as shown in FIG. 16D, the part 1221 of the element formation layer, the flexible substrate 1222, and the second adhesive agent 1223 are divided. Here, the part 1221 of the element formation layer and the flexible substrate 1222 are irradiated with laser beams 1234 as shown in FIG. 16C to form grooves 1241 as shown in FIG. 16D, thereby dividing the part 1221 of the element formation layer into a plurality of sections. As the laser beams 1234, laser beams described as the laser beams 1213 can be used as appropriate. Here, laser beams which can be absorbed by the insulating layers 1203, 1205, 1207, and 1212, and the flexible substrate 1222 are preferably used. Note that although the part of the element formation layer is divided into a plurality of sections by a laser cutting method here, a dicing method, a scribing method, or the like can be used as appropriate instead of the laser cutting method. Note also that in the case of using fibrous paper as the flexible substrate 1222, it is preferable, in dividing the element formation layer by a dicing method, not to use water but to blow a gas to the portions to be cut so that dust produced by cutting can be blown away. As a result, the element formation layer and the paper can be prevented from being separated from each other. Further, by conducting dicing while blowing a high-humidity gas to the portions to be cut, the element formation layer can be prevented form being charged with static electricity. The element formation layers obtained after the cutting are referred to as semiconductor integrated circuits 1242a and 1242b.

Next, after attaching an expander frame 1244 to the UV tape 1231 as shown in FIG. 17A, the dicing frame 1232 are taken off the UV tape. At this time, by attaching the semiconductor integrated circuits 1242a and 1242b while stretching the UV tape 1231 by the expander frame 1244, the width of each groove 1241 formed between the semiconductor integrated circuits 1242a and 1242b can be increased.

The UV tape 1231 attached to the expander frame 1244 is irradiated with UV light to decrease the adhesiveness of the UV sheet. With the use of the manufacturing apparatus of a semiconductor device described in Embodiment Mode 1, the expander frame 1244 mounted with the semiconductor integrated circuits 1242*a* and 1242*b* is fixed to the support unit 20. Here, a robot arm which sandwiches the expander frame 1244 is used as the support unit.

Next, with the use of the flip-chip unit 36 in FIG. 6B of the manufacturing apparatus of a semiconductor device described in Embodiment Mode 1, the semiconductor integrated circuits 1242*a* and 1242*b* are held by the holders 203 of the flip-chip unit (see FIG. 17B).

Then, after rotating the flip-chip unit 36 as shown in FIG. 18A, the semiconductor integrated circuits 1242*a* and 1242*b* are temporarily attached to the first flexible substrate 206. An adhesive layer is provided over a surface of the first flexible substrate 206, so that the semiconductor integrated circuits 1242*a* and 1242*b* can be temporarily attached to the first flexible substrate 206.

After this, as shown in FIG. 18B, the holders 203 of the flip-chip unit are separated from the semiconductor integrated circuits 1242*a* and 1242*b*.

The first flexible substrate 206 is fed by rotating the supply portion, the recovery portion, and the like of the first flexible substrate 206 to arrange the semiconductor integrated circuits 1242*a* and 1242*b* over the first flexible substrate 206 and the antennas 209*a* and 209*b* over the second flexible substrate 208 to face each other as shown in FIG. 19A. In other words, connection terminals 1233*a* and 1233*b* of the semiconductor integrated circuits 1242*a* and 1242*b* are aligned to face the antennas 209*a* and 209*b* with an anisotropic conductive film 210 interposed therebetween. Note that surfaces of the antennas 209*a* and 209*b* are provided with an anisotropic conductive film 210. Alternatively, the surfaces may be coated with an anisotropic conductive resin instead of the anisotropic conductive film.

The first flexible substrate 206 and the second flexible substrate 211 are attached to each other with pressure using a bonding unit 274 to connect the semiconductor integrated circuit 1242*a* and the antenna 209*a* through conductive particles included in the connection terminal 1233*a* and the anisotropic conductive film 210. In addition, the semiconductor integrated circuit 1242*b* and the antenna 209*b* are connected through conductive particles included in the connection terminal 1233*b* and the anisotropic conductive film 210.

Then, the bonding unit 274 is returned to the original position. At this time, the adhesion between the anisotropic conductive film 210 and the semiconductor integrated circuits 1242*a* and 1242*b* is preferably higher than that between the first flexible substrate 206 and the semiconductor integrated circuits 1242*a* and 1242*b*. Accordingly, the semiconductor integrated circuits 1242*a* and 1242*b* can be moved from the first flexible substrate 206 to the second flexible substrate 208, and the semiconductor integrated circuits 1242*a* and 1242*b* and the antennas 209*a* and 209*b* can be connected to each other.

Next, as shown in FIG. 19B, the second flexible substrate 208 is divided in a region where the antennas 209*a* and 209*b* and the semiconductor integrated circuits 1242*a* and 1242*b* are not formed. As a dividing method, a laser cutting method, a dicing method, a scribing method, or the like can be used as appropriate. Here, dividing is conducted by a laser cutting method in which the anisotropic conductive film 210 and the second flexible substrate 208 are irradiated with a laser beam 1251.

Though the above steps, semiconductor devices 1252*a* and 1252*b* capable of contactless data transmission can be manufactured.

Note that a semiconductor device may be manufactured as follows. After the antennas 209*a* and 209*b* and the semiconductor integrated circuits 1242*a* and 1242*b* are attached to each other using the anisotropic conductive film 210 in FIG. 19A, a third flexible substrate is provided to seal the second flexible substrate 208 and the semiconductor integrated circuits 1242*a* and 1242*b*, and the region where the antennas 209*a* and 209*b* and the semiconductor integrated circuits 1242*a* and 1242*b* are not formed is irradiated with the laser beam 1251 as shown in FIG. 19B. Thus, a semiconductor device 1262 as shown in FIG. 19C may be manufactured. In this case, the deterioration of the thin film integrated circuit can be suppressed because the thin film integrated circuit is sealed with the divided second flexible substrate 208*a* and the divided third flexible substrate 211*a*.

Through the above steps, semiconductor devices which are thin and lightweight can be manufactured with high yield.

Embodiment 2

Figure 21:
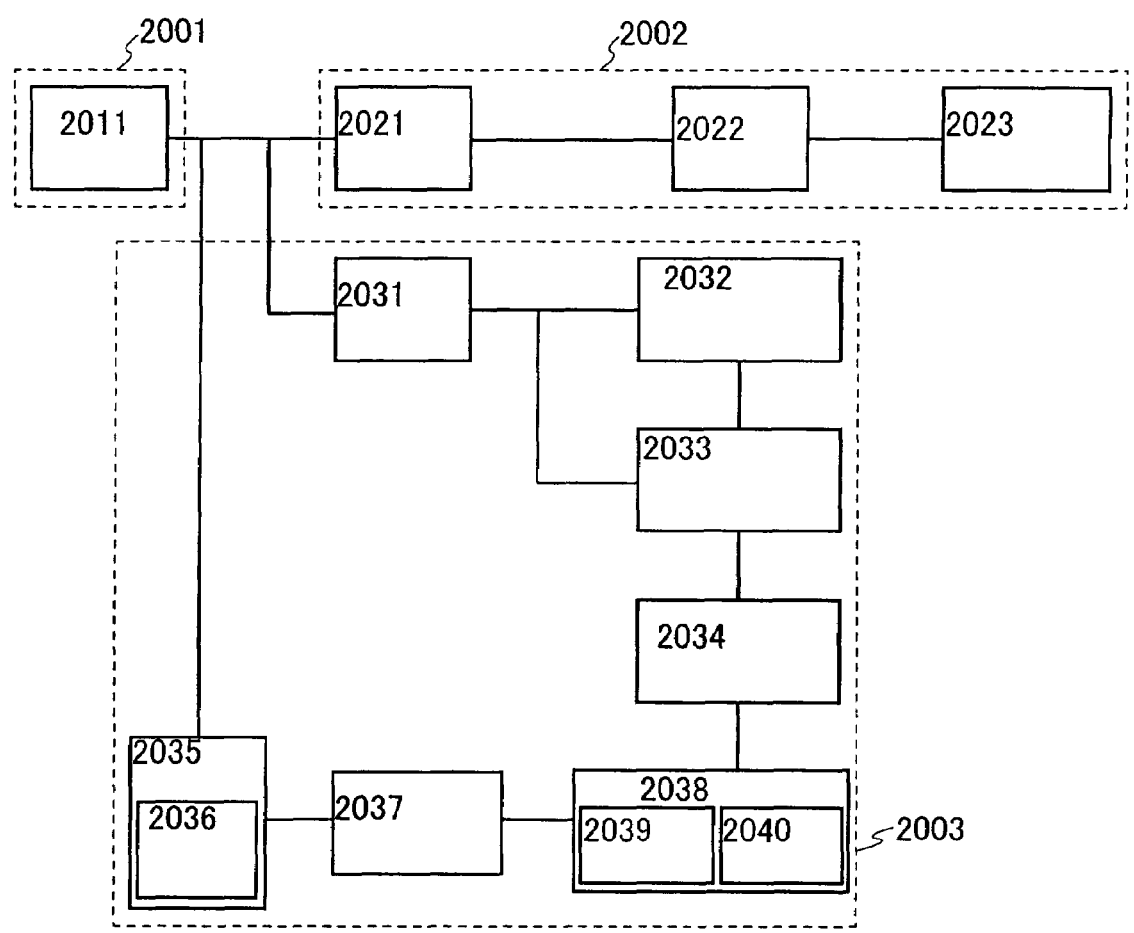
FIG. 21 is a diagram illustrating a semiconductor device of the present invention.

This embodiment describes a structure of a semiconductor device capable of contactless data transmission with reference to FIG. 21.

A semiconductor device of this embodiment includes an antenna portion 2001, a power supply portion 2002, and a logic portion 2003 as its main components.

The antenna portion 2001 includes an antenna 2011 for receiving external signals and transmitting data. A signal transmission method of the semiconductor device can be any of an electromagnetic coupling method, an electromagnetic induction method, a microwave method, and the like.

The power supply portion 2002 includes a rectifier circuit 2021 which produces power from a signal received from outside through the antenna 2011, a storage capacitor 2022 which stores the produced power, and a constant voltage circuit 2023 which produces a constant voltage to be supplied to each circuit.

The logic circuit portion 2003 includes a demodulation circuit 2031 for demodulating received signals, a clock generation/correction circuit 2032 for generating clock signals, a code recognition/judgment circuit 2033, a memory controller 2034 for generating signals for reading out data from a memory based on the received signals, a modulation circuit 2035 for superposing an encoded signal on the received signal, an encoding circuit 2037 for encoding the data read out, and a memory 2038 for storing data. Note that the modulation circuit 2035 includes a modulation resistor 2036.

The memory 2038 is appropriately selected from a DRAM (Dynamic Random Access Memory), an SRAM (Static Random Access Memory), an FeRAM (Ferroelectric Random Access Memory), a mask ROM (Mask Read Only Memory), an EPROM (Electrically Programmable Read Only Memory), an EEPROM (Electrically Erasable and Programmable Read Only Memory), a flash memory, an organic memory, or the like. Here, the memory 2038 includes a mask ROM 2039 and a rewritable memory 2040 formed using an organic memory.

A code recognized and judged by the code recognition/judgment circuit 2033 is a frame termination signal (EOF, End of Frame), a frame start signal (SOF, Start of Frame), a flag, a command code, a mask length, a mask value, or the like. The code recognition/judgment circuit 2033 also has a cyclic redundancy check (CRC) function for discriminating transmission errors.

Embodiment 3

Figure 22A:
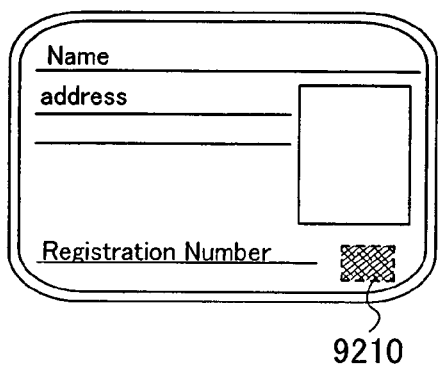
FIGS. 22A to 22F are diagrams each illustrating an application example of a semiconductor device of the present invention.
Figure 22B:
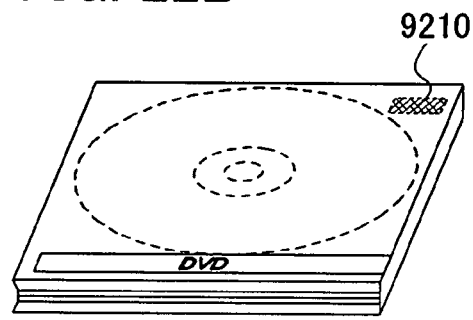
Figure 22C:
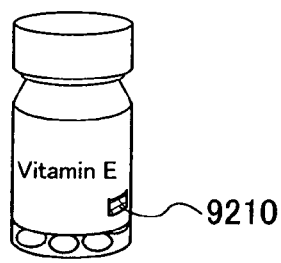
Figure 22D:
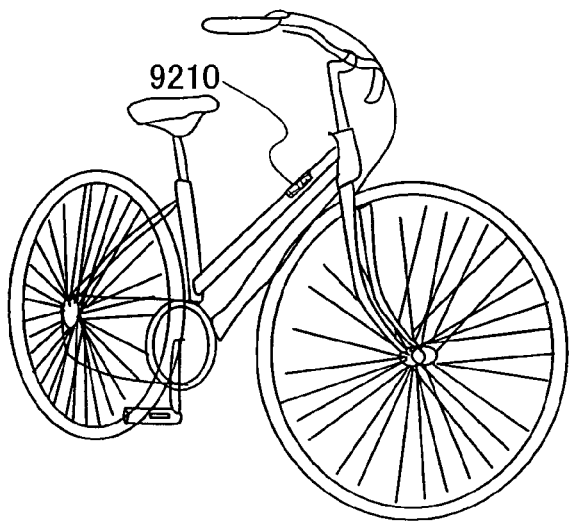
Figure 22E:
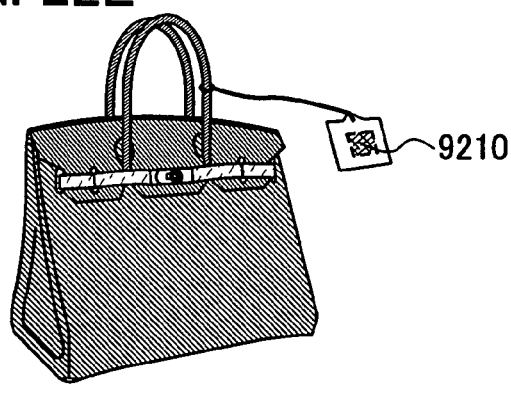
Figure 22F:
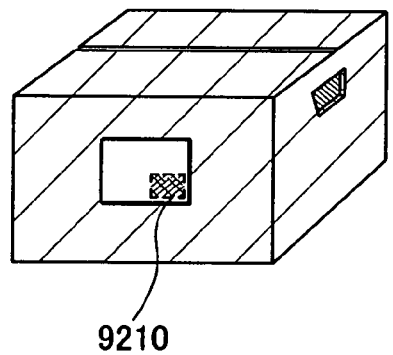

The semiconductor device capable of contactless data transmission as described in the above embodiment can be applied to various uses, such as paper money, coins, securities, bearer bonds, certificates (e.g., driver's licenses or resident's cards, see FIG. 22A), packing containers (e.g., wrapping paper or bottles, see FIG. 22C), recording media (e.g., DVD software or video tapes, see FIG. 22B), vehicles (e.g., bicycles, see FIG. 22D), personal belongings (e.g., shoes or glasses), food, plants, animals, human bodies, clothing, commodities, or tags on goods such as electronic devices or bags (see FIGS. 22E and 22F). Note that electronic devices include a liquid crystal display device, an EL display device, a television set (also simply referred to as a TV, a TV receiver, or a television receiver), a mobile phone, and the like.

A semiconductor device 9210 of this embodiment is fixed to an article by being mounted on a printed board, being attached to a surface of the article, being embedded in the article, or the like. For example, the semiconductor device is fixed to an article by being embedded in paper in the case of a book, or by being embedded in an organic resin in the case of a package made of the organic resin. The semiconductor device 9210 of this embodiment achieves smallness, thinness, and lightness, and therefore does not harm the design of the article itself. In addition, paper money, coins, securities, bearer bonds, certificates, and the like can have an authentication function when provided with the semiconductor devices 9210 of this embodiment, and this authentication function can be utilized to prevent falsification. Further, when packing containers, recoding media, personal belongings, food, clothing, commodities, electronic devices, and the like are provided with the semiconductor device of this embodiment, a system such as an inspection system can have higher efficiency.

This application is based on Japanese Patent Application serial no. 2006-151506 filed in Japan Patent Office on May 31, 2006, the entire contents of which are hereby incorporated by reference.

What is claimed is:

1. A manufacturing method of a semiconductor device, comprising:
   arranging a plurality of semiconductor integrated circuits in a matrix over a support unit so as to have a row interval of x (x>0) and a column interval of y (y>0);
   temporarily attaching the plurality of semiconductor integrated circuits to a first flexible substrate row by row while changing the row interval to a (a>x) without changing the column interval;
   arranging a plurality of antennas in a matrix over a second flexible substrate so as to have a column interval of the a and a row interval of b (b>y);
   moving the second flexible substrate in a row direction of the plurality of antennas so as to intersect with the row direction of the plurality of semiconductor integrated circuits over the first flexible substrate; and
   transferring the plurality of semiconductor integrated circuits from the first flexible substrate onto the plurality of antennas, allowing the plurality of semiconductor integrated circuits to be separated from the first flexible substrate,
   wherein the attachment of the plurality of semiconductor integrated circuits to the first flexible substrate is performed by the steps of:
   interposing the first flexible substrate between the support unit and a pickup unit having a plurality of projections; and
   attaching the first flexible substrate to the plurality of semiconductor integrated circuits by moving the pickup unit.

2. A manufacturing method of a semiconductor device according to claim 1, wherein the transfer of the plurality of semiconductor integrated circuits is performed so as to allow the semiconductor integrated circuits to be transferred at the same time column by column of the semiconductor integrated circuits which are located on the first substrate.

3. A manufacturing method of a semiconductor device, comprising:
   arranging a plurality of semiconductor integrated circuits in a matrix over a support unit so as to have a row interval of x (x>0) and a column interval of y (y>0);
   temporarily attaching the plurality of semiconductor integrated circuits to a first flexible substrate row by row while changing the row interval to a (a>x) without changing the column interval;
   arranging a plurality of antennas in a matrix over a second flexible substrate so as to have a column interval of the a and a row interval of b(b>y);
   moving the second flexible substrate in a row direction of the plurality of antennas and moving the first flexible substrate in a row direction of the plurality of semiconductor integrated circuits so as to intersect with the row direction of the plurality of antennas; and
   transferring the plurality of semiconductor integrated circuits from the first flexible substrate onto the plurality of antennas, allowing the plurality of semiconductor integrated circuits to be separated from the first flexible substrate,
   wherein the attachment of the plurality of semiconductor integrated circuits to the first flexible substrate is performed by the steps of:
   interposing the first flexible substrate between the support unit and a pickup unit having a plurality of projections; and
   attaching the first flexible substrate to the plurality of semiconductor integrated circuits by moving the pickup unit.

4. A manufacturing method of a semiconductor device according to claim 3, wherein the transfer of the plurality of semiconductor integrated circuits is performed so as to allow the semiconductor integrated circuits to be transferred at the same time column by column of the semiconductor integrated circuits which are located on the first substrate.

5. A manufacturing method of a semiconductor device, comprising:
   arranging a plurality of semiconductor integrated circuits over a support unit in a matrix with m (m is a natural number) rows and n (n is a natural number) columns so as to have a row interval of x (x>0) and a column interval of y (y>0);
   temporarily attaching the plurality of semiconductor integrated circuits to a first flexible substrate row by row while changing the row interval to a (a>x) without changing the column interval;
   arranging a plurality of antennas in a matrix with p columns over a second flexible substrate so as to have a column interval of the a and a row interval of b (b>y) and so as to arrange a plurality of connection portions on a line parallel to a row direction;
   moving the second flexible substrate in a row direction of the plurality of antennas; and
   transferring semiconductor integrated circuits in a j-th (j is a natural number equal to or greater than 1 and equal to or less than p) row from the first flexible substrate the connection portions of the antennas in a j-th column, allowing the semiconductor integrated circuits in the j-th row to be separated from the first flexible substrate, wherein the attachment of the plurality of semiconductor integrated circuits to the first flexible substrate is performed by the steps of:

interposing the first flexible substrate between the support unit and a pickup unit having a plurality of projections; and attaching the first flexible substrate to the plurality of semiconductor integrated circuits by moving the pickup unit.

6. A manufacturing method of a semiconductor device according to claim 5, wherein the transfer in the j-th semiconductor integrated circuits is performed so that the j-th semiconductor integrated circuits are transferred onto the plurality of antennas at the same time.

7. A manufacturing method of a semiconductor device, comprising:

arranging a plurality of semiconductor integrated circuits in a matrix with m (m is a natural number) rows and n (n is a natural number) columns over a support unit so as to have a row interval of x (x>0) and a column interval of y (y>0);

temporarily attaching the plurality of semiconductor integrated circuits to a first flexible substrate row by row while changing the row interval to a (a>x) without changing the column interval;

arranging a plurality of antennas in a matrix with q (q is a natural number) rows and p columns over a second flexible substrate so as to have a column interval of the a and a row interval of b (b>y) and so as to arrange connection portions on a line parallel to a row direction;

transferring a semiconductor integrated circuit in an i-th (i is a natural number equal to or greater than 1 and equal to or less than p) row and a j-th (j is a natural number equal to or greater than 1 and equal to or less than q) column from the first flexible substrate to a connection portion of an antenna in a j-th row and an i-th column, allowing the semiconductor integrated circuit in the i-th row and the j-th column to be separated from the first flexible substrate;

subsequently moving the second flexible substrate to a row direction of the plurality of antennas; and transferring a semiconductor integrated circuits in the i-th row and a (j+1)-th column from the first flexible substrate to a connection portions of the antennae in a (j+1)-th row and the i-th column, allowing the semiconductor integrated circuit in the i-th row and the (j+1)-th column to be separated from the first flexible substrate, wherein the attachment of the plurality of semiconductor integrated circuits to the first flexible substrate is performed by the steps of:

interposing the first flexible substrate between the support unit and a pickup unit having a plurality of projections; and attaching the first flexible substrate to the plurality of semiconductor integrated circuits by moving the pickup unit.

8. A manufacturing method of a semiconductor device according to claim 7, wherein the semiconductor integrated circuit in the i-th row and the j-th column and the semiconductor integrated circuit in the i-th row and the (j+1)-th column are transferred at the same time.

9. A manufacturing method of a semiconductor device according to claim 1, wherein the antenna is connected on a surface of the semiconductor integrated circuit, on which the support unit is provided.

10. A manufacturing method of a semiconductor device according to claim 3, wherein the antenna is connected on a surface of the semiconductor integrated circuit, on which the support unit is provided.

11. A manufacturing method of a semiconductor device according to claim 5, wherein the connection portion of the antenna is connected on a surface of the semiconductor integrated circuit, on which the support unit is provided.

12. A manufacturing method of a semiconductor device according to claim 7, wherein the connection portion of the antenna is connected on a surface of the semiconductor integrated circuit, on which the support unit is provided.

* * * * *

UNITED STATES PATENT AND TRADEMARK OFFICE
CERTIFICATE OF CORRECTION

| | | |
|---|---|---|
| PATENT NO. | : 7,727,809 B2 | Page 1 of 1 |
| APPLICATION NO. | : 11/798979 | |
| DATED | : June 1, 2010 | |
| INVENTOR(S) | : Kyosuke Ito et al. | |

It is certified that error appears in the above-identified patent and that said Letters Patent is hereby corrected as shown below:

column 17, line 42, "first top-th" should read "first to p-th"

column 17, line 44, "to pth columns" should read "to p-th columns"

column 18, line 15, "top-th columns" should read "to p-th columns"

column 18, line 27, "first top-th rows" should read "first to p-th rows"

column 18, line 57, "denoted byy." should read "denoted by $y$."

column 24, line 23, "Abase insulating layer" should read "A base insulating layer"

column 32, line 66, claim 5, "flexible substrate the" should read "flexible substrate onto the"

Signed and Sealed this
First Day of March, 2011

David J. Kappos
*Director of the United States Patent and Trademark Office*